United States Patent
Zhang et al.

(10) Patent No.: US 10,777,468 B1
(45) Date of Patent: Sep. 15, 2020

(54) STACKED VERTICAL FIELD-EFFECT TRANSISTORS WITH SACRIFICIAL LAYER PATTERNING

(71) Applicant: International Business Machines Corporation, Armonk, NY (US)

(72) Inventors: Chen Zhang, Guilderland, NY (US); Tenko Yamashita, Schenectady, NY (US); Kangguo Cheng, Schenectady, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/360,353

(22) Filed: Mar. 21, 2019

(51) Int. Cl.
*H01L 21/8234* (2006.01)
*H01L 29/423* (2006.01)
*H01L 21/8238* (2006.01)
*H01L 21/285* (2006.01)
*H01L 21/311* (2006.01)

(52) U.S. Cl.
CPC ........... *H01L 21/823871* (2013.01); *H01L 21/28568* (2013.01); *H01L 21/31111* (2013.01); *H01L 21/31144* (2013.01); *H01L 21/823814* (2013.01); *H01L 21/823878* (2013.01); *H01L 21/823885* (2013.01)

(58) Field of Classification Search
CPC .......... H01L 29/66666; H01L 29/7827; H01L 29/78642; H01L 21/823885; H01L 21/823487
See application file for complete search history.

(56) References Cited

U.S. PATENT DOCUMENTS

| 5,612,563 | A | 3/1997 | Fitch et al. |
| 6,268,621 | B1 | 7/2001 | Emmi et al. |
| 7,683,428 | B2 | 3/2010 | Chidambarrao et al. |
| 7,892,956 | B2 | 2/2011 | Deligianni et al. |
| 9,177,890 | B2 | 11/2015 | Du |

(Continued)

OTHER PUBLICATIONS

B. Wu et al, "Pillar Dram Cell with Dual Channels and an Underneath Trench-in-Trench Capacitor Built on SOI Structure," IP.com No. IPCOM000106426D, Nov. 1, 1993, 5 pages.

*Primary Examiner* — Bradley Smith
*Assistant Examiner* — David J Goodwin
(74) *Attorney, Agent, or Firm* — Vazken Alexanian; Ryan, Mason & Lewis, LLP

(57) ABSTRACT

A method of forming a semiconductor structure includes forming a stacked vertical transport field-effect transistor (VTFET) structure and a sacrificial layer in contact with a source/drain region of the stacked vertical transport field-effect transistor structure. A masking layer is formed over the sacrificial layer. The masking layer defines a pattern to be patterned into the sacrificial layer. The sacrificial layer is patterned based on the masking layer to form a patterned sacrificial layer and the masking layer is removed. A portion of the stacked VTFET structure is etched down to a surface of the patterned sacrificial layer and the patterned sacrificial layer is removed to form a channel exposing the source/drain region. A contact material is formed in the etched portion of the stacked vertical transport field-effect transistor structure and in the channel. The contact material is formed in contact with the exposed source/drain region.

20 Claims, 16 Drawing Sheets

(56) References Cited

U.S. PATENT DOCUMENTS

| | | | |
|---|---|---|---|
| 9,659,963 B2 | 5/2017 | Cheng et al. | |
| 9,721,845 B1 | 8/2017 | Cheng et al. | |
| 9,748,380 B1 | 8/2017 | Lie et al. | |
| 9,997,413 B1 * | 6/2018 | Leobandung | H01L 21/823487 |
| 10,157,794 B1 * | 12/2018 | Suvarna | H01L 29/7827 |
| 10,361,315 B1 * | 7/2019 | Yeh | H01L 29/66545 |
| 10,468,525 B1 * | 11/2019 | Cheng | H01L 21/823885 |
| 2015/0017767 A1 * | 1/2015 | Masuoka | H01L 27/1116 438/211 |
| 2016/0043074 A1 | 2/2016 | Hurley et al. | |
| 2017/0025412 A1 | 1/2017 | Jun et al. | |
| 2020/0119012 A1 * | 4/2020 | Rubin | H01L 21/8221 |

\* cited by examiner

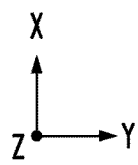
FIG. 10
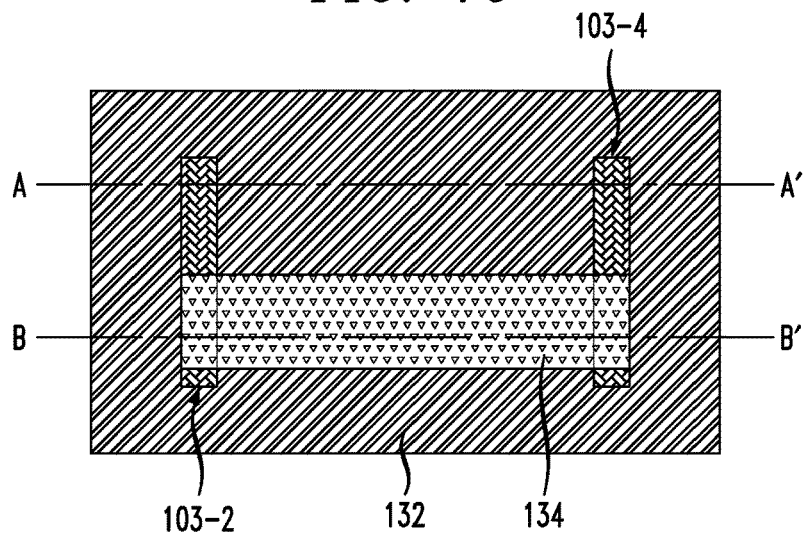
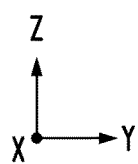
FIG. 11
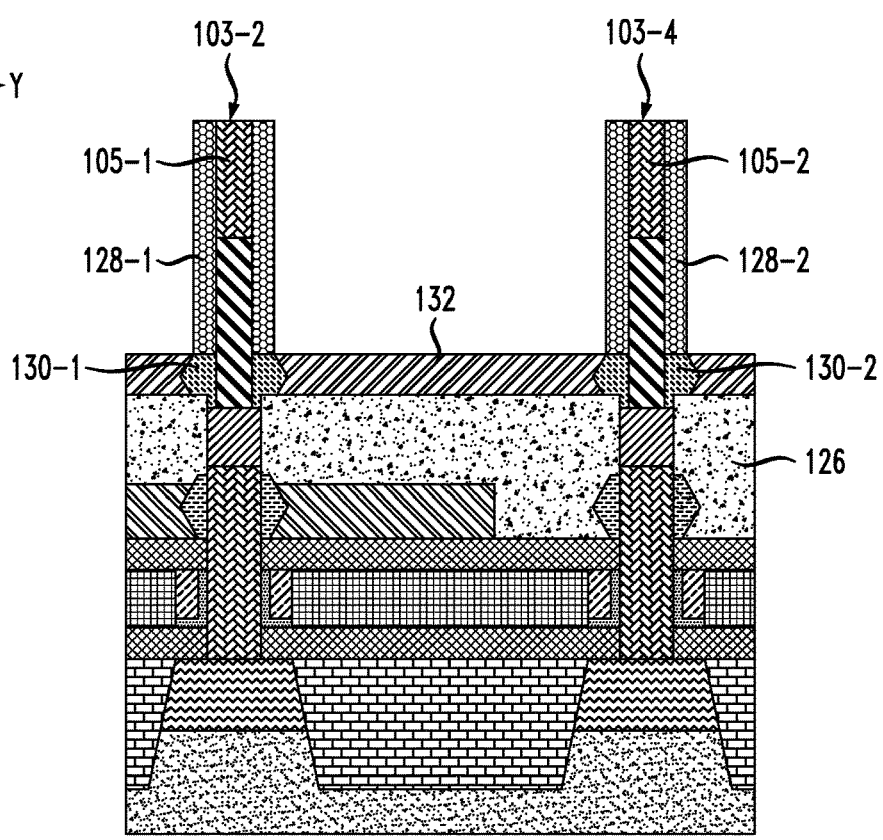

STACKED VERTICAL FIELD-EFFECT TRANSISTORS WITH SACRIFICIAL LAYER PATTERNING

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming contacts in stacked vertical transport field-effect transistors.

In one embodiment, a method of forming a semiconductor structure comprises forming a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. A sacrificial layer is formed in contact with a source/drain region of the stacked vertical transport field-effect transistor structure and a masking layer is formed over the sacrificial layer. The masking layer defines a pattern to be patterned into the sacrificial layer. The sacrificial layer is patterned based on the masking layer to form a patterned sacrificial layer and the masking layer is removed. A portion of the stacked vertical transport field-effect transistor structure is etched down to a surface of the patterned sacrificial layer and the patterned sacrificial layer is removed to form a channel exposing the source/drain region. A contact material is formed in the etched portion of the stacked vertical transport field-effect transistor structure and in the channel. The contact material is formed in contact with the exposed source/drain region.

In another embodiment, a method of forming a semiconductor structure comprises forming a stacked vertical transport field-effect transistor structure comprising at least a first vertical fin and a second vertical fin, each vertical fin comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. Top source/drain regions are formed on the first semiconductor layers of the first and second vertical fins below the isolation layers and a sacrificial layer is formed in contact with the top source/drain regions formed on the first semiconductor layers of the first and second vertical fins and below the isolation layers. A masking layer is formed over the sacrificial layer. The masking layer defines a pattern to be patterned into the sacrificial layer. The sacrificial layer is patterned based on the masking layer to form at least a first patterned sacrificial layer and a second patterned sacrificial layer. The first patterned sacrificial layer is in contact with the top source/drain region formed on the first semiconductor layer of the first vertical fin and the second patterned sacrificial layer is in contact with the top source/drain region formed on the first semiconductor layer of the second vertical fin. The masking layer is removed and an interlayer dielectric layer is formed on the stacked vertical transport field-effect transistor structure. The interlayer dielectric layer isolates the first patterned sacrificial layer from the second patterned sacrificial layer. A first portion of the stacked vertical transport field-effect transistor structure is etched down through the interlayer dielectric layer to expose a surface of the first patterned sacrificial layer and a second portion of the stacked vertical transport field-effect transistor structure is etched down through the interlayer dielectric layer to expose a surface of the second patterned sacrificial layer. The first patterned sacrificial layer is removed to form a first channel exposing the top source/drain region formed on the first semiconductor layer of the first vertical fin and the second patterned sacrificial layer is removed to form a second channel exposing the top source/drain region formed on the first semiconductor layer of the second vertical fin. A first contact material is formed in the etched first portion of the stacked vertical transport field-effect transistor structure and in the first channel. The first contact material is formed in contact with the exposed top source/drain region formed on the first semiconductor layer of the first vertical fin. A second contact material is formed in the etched second portion of the stacked vertical transport field-effect transistor structure and in the second channel. The second contact material is formed in contact with the exposed top source/drain region formed on the first semiconductor layer of the second vertical fin.

In another embodiment, a method of forming a semiconductor structure comprises forming a stacked vertical transport field-effect transistor structure comprising at least a first vertical fin and a second vertical fin, each vertical fin comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor. Top source/drain regions are formed on the first semiconductor layers of the first and second vertical fins below the isolation layers and a first sacrificial layer is formed in contact with the top source/drain regions formed on the first semiconductor layers of the first and second vertical fins and below the isolation layers. A first masking layer is formed over the first sacrificial layer. The first masking layer defines a pattern to be patterned into the first sacrificial layer. The first sacrificial layer is patterned based on the first masking layer to form a first patterned sacrificial layer. The first patterned sacrificial layer is in contact with the top source/drain region formed on the first semiconductor layer of the second vertical fin. The first masking layer is removed and an interlayer dielectric layer is formed on the stacked vertical transport field-effect transistor structure over the first patterned sacrificial layer. Bottom source/drain regions are formed on the second semiconductor layers of the first and second vertical fins above the isolation layers and the interlayer dielectric layer and a second sacrificial layer is formed on the interlayer dielectric layer and in contact with the bottom source/drain regions formed on the second semiconductor layers of the first and second vertical fins. A second masking layer is formed over the second sacrificial layer. The second masking layer defines a second pattern to be patterned into the second sacrificial layer. The second sacrificial layer is patterned based on the second masking layer to form a second patterned sacrificial layer. The second patterned sacrificial layer is in contact with the bottom source/drain region formed on the second semiconductor layer of the first vertical fin and is in contact with the bottom source/drain region formed on the second semiconductor layer of the second vertical fin. The second masking layer is removed and a portion of the stacked vertical transport field-effect transistor structure is etched down through the second patterned sacrificial layer and through the interlayer dielectric layer to expose a surface of the first patterned sacrificial layer and to expose a surface of the second patterned sacrificial layer. The first and second patterned sacrificial layers are removed to form channels exposing the top source/drain region formed on the first semiconductor layer of the second vertical fin and the bottom source/drain regions formed on the second semiconductor layers of the first and second vertical fins. A contact material is formed in the etched portion of the stacked vertical transport field-effect transistor structure and in the channels. The contact material is formed in contact with the exposed top source/drain region formed on the first semiconductor layer of the second vertical fin and the exposed bottom source/drain regions formed on the second semiconductor layers of the first and second vertical fins.

Other embodiments will be described in the following detailed description of embodiments, which is to be read in conjunction with the accompanying figures.

BRIEF DESCRIPTION OF THE DRAWINGS

FIG. 10 depicts a top down view of the structure of FIG. 8 following formation of a second masking layer over a portion of the second sacrificial layer, according to an embodiment of the invention.

FIG. 11 depicts a cross-sectional view of the structure of FIG. 10 along section line A-A', according to an embodiment of the invention.

DETAILED DESCRIPTION

Figure 1:
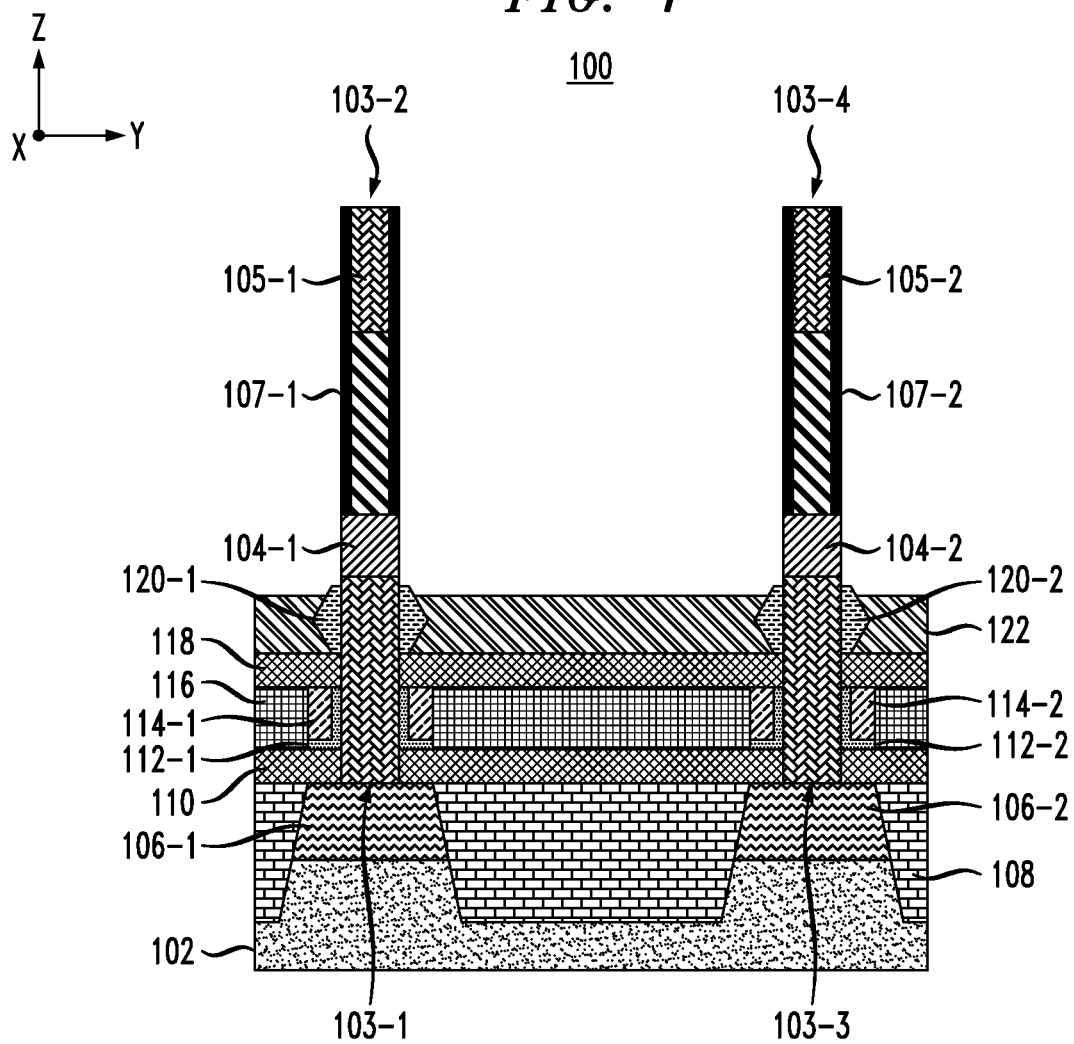
FIG. 1 depicts a cross-sectional view of a stacked vertical transport field-effect transistor structure at an intermediate stage of fabrication, according to an embodiment of the invention.

Illustrative embodiments of the invention may be described herein in the context of illustrative methods for forming contacts in stacked vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Stacking FETs in a vertical direction gives an additional dimension for CMOS area scaling. It is difficult, however, to stack planar FETs. Vertical transport FETs (VTFETs) are being pursued as viable CMOS architectures for scaling to 5 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration.

Stacking VTFETs may provide further advantages in reducing the area and enabling a denser circuit layout. Due to the vertical integration nature of vertically stacked VTFETs, however, the middle-of-line (MOL) metal connection to the VTFET devices is very challenging. Illustrative embodiments provide a sacrificial oxide patterning process during fabrication of stacked VTFETs to enable improved and simplified patterning for later metal fill as will be described in further detail below.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIG. 1 shows a schematic cross-sectional view 100 (Y-Z plane) of a stacked VTFET structure at an intermediate stage of fabrication. The stacked VTFET structure of FIG. 1 includes a substrate 102 and vertical fins 103-1, 103-2, 103-3 and 103-4 (collectively, vertical fins 103) formed over the substrate 102. The vertical fins 103-1 and 103-2 are separated by a first isolation layer 104-1, and the vertical fins 103-3 and 103-4 are separated by a second isolation layer 104-2. The first and second isolation layers 104-1 and 104-2 (collectively, isolation layers 104) may be formed from a same starting layer.

The vertical fins 103 provide vertical transport channels for respective VTFETs. The vertical fin 103-1 provides a vertical transport channel for a first "lower" VTFET, the vertical fin 103-2 provides a vertical transport channel for a first "upper" VTFET, the vertical fin 103-3 provides a vertical transport channel for a second "lower" VTFET, and the vertical fin 103-4 provides a vertical transport channel for a second "upper" VTFET.

In some embodiments, the vertical fins 103 provide vertical transport channels for a same type of VTFET (e.g., one of nFETs and pFETs). In other embodiments, different ones of the vertical fins 103 provide vertical transport channels for different types of VTFETs. For example, the vertical fins 103-1 and 103-2 may provide vertical transport channels for one of nFET and pFET VTFETs, while the vertical fins 103-3 and 103-4 provide vertical transport channel for the other one of nFET and pFET VTFETs. As another example, the vertical fins 103-1 and 103-3 (e.g., for the "lower" VTFETs) may provide vertical transport channels for one of nFET and pFET VTFETs while the vertical fins 103-2 and 103-4 (e.g., for the "upper" VTFETs) provide vertical transport channels for the other one of nFET and pFET VTFETs. Various other combinations are possible.

As illustrated in FIG. 1, the vertical fins 103-1 and 103-3 have a first, wider thickness (in direction Y) for the lower VTFETs and the vertical fins 103-2 and 103-4 have a second, narrower thickness (in direction Y) for the upper VTFETs. In some embodiments the horizontal width or thickness (in direction Y) of the vertical fins 103-1 and 103-3 for the lower VTFETs is in the range of 5 to 12 nm and the horizontal width or thickness (in direction Y) of the vertical fins 103-2 and 103-4 for the upper VTFETs is in the range of 4 to 10 nm. The height or vertical thickness (in direction Z) of the vertical fins 103-1 and 103-3, as measured from a top surface of the substrate 102, may be in the range of 30 to 70 nm. The height or vertical thickness (in direction Z) of the vertical fins 103-2 and 103-4, as measured from a top surface of the isolation layers 104, may be in the range of 30 to 70 nm.

The substrate 102 and vertical fins 103 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

In some embodiments, the starting structure includes the substrate 102, the isolation layer 104 and an additional semiconductor layer (e.g., which provides material for the vertical fins 103-2 and 103-4). The vertical fins 103 may be formed using sidewall image transfer (SIT) or other suitable techniques such as lithography and etching including reactive-ion etching (RIE), etc. This may involve patterning a hardmask layer (e.g., formed of a nitride such as silicon nitride (SiN)) over the additional semiconductor layer to form hardmask layers 105-1 and 105-2 and then etching down to isolation layer 104 to form vertical fins 103-2 and 103-4. Sidewall spacers 107-1 and 107-2 are then formed using conventional techniques, and further etching is performed using hardmask layers 105-1 and 105-2 and sidewall spacers 107 as a pattern to etch down the isolation layer 104 and substrate 102 to form fins 103-1 and 103-3. In other embodiments, the lower VTFETs may be formed first, followed by deposition of the isolation layer 104 and then subsequent formation of the upper VTFETs.

The isolation layer 104 may be formed of an insulating material such as silicon dioxide ($SiO_2$), SiN, silicon oxycarbide (SiOC), etc. The isolation layer 104 may have a height or vertical thickness (in direction Z) in the range of 10 to 20 nm.

Although FIG. 1 shows an example where just two sets of vertical fins are formed (e.g., vertical fins 103-1 and 103-2, and vertical fins 103-3 and 103-4), it should be appreciated that more or fewer than two sets of vertical fins may be formed depending on the desired number of VTFETs for the resulting structure. In addition, while FIG. 1 illustrates stacking just two VTFETs, it should be appreciated that three or more VTFETs may be stacked on top of one another.

The FIG. 1 VTFET structure at the intermediate stage of fabrication further includes bottom source/drain regions 106-1 and 106-2 (collectively, bottom source/drain regions 106) for the lower VTFETs. The bottom source/drain regions 106 are disposed below portions of the vertical fins 103-1 and 103-3 as illustrated. The bottom source/drain regions 106 may have a height or vertical thickness (in direction Z) in the range of 15 to 30 nm. The bottom source/drain regions 106 may have a width or horizontal thickness (in direction Y) in the range of 40 to 60 nm.

The bottom source/drain regions 106 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain regions 106 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The bottom/source drain regions 106 are surrounded by a shallow trench isolation (STI) layer 108. The STI layer 108 may have a height or vertical thickness (in direction Z) in the range of 50 to 400 nm.

A bottom spacer 110 for the lower VTFETs is formed surrounding a portion of the vertical fins 103-1 and 103-2 above the bottom source/drain regions 106 and the STI layer 108. The bottom spacer 110 may be formed using various processing, such as non-conformal deposition and etch-back processing (e.g., physical vapor deposition (PVD), high density plasma (HDP) deposition, etc.). The bottom spacer 110 may be formed of a dielectric material such as $SiO_2$, SiN, silicon carbide oxide (SiCO), silicon boron carbide nitride (SiBCN), etc. The bottom spacer 110 may have a height or vertical thickness (in direction Z) in the range of 3 to 10 nm.

Above the bottom spacer 110, a gate stack for the lower VTFETs is formed. The gate stack includes gate dielectric layers 112-1 and 112-2 (collectively, gate dielectric layers 112) and gate conductor layers 114-1 and 114-2 (collectively, gate conductor layers 114).

The gate dielectric layers 112 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layers 112 may have a uniform thickness in the range of 1 nm to 3 nm.

The gate conductor layers 114 may include a metal gate or work function metal (WFM). In some embodiments, the gate conductor layers 114 are formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor as desired. The gate conductor layers 114 may have a horizontal width or thickness (in direction Y) in the range of 5 to 20 nm.

The gate stack (e.g., the gate dielectric layers 112 and gate conductor layers 114 may collectively have a height or vertical thickness (in direction Z) in the range of 10 to 30 nm on vertical sidewalls of the vertical fins 103-1 and 103-3.

An interlayer dielectric (ILD) 116 is then formed surrounding the gate stack for the lower VTFETs. The ILD 116 may be formed of any suitable isolation material, such as $SiO_2$, SiOC, SiON, etc.

Top spacer 118 for the lower VTFETs is formed surrounding a portion of the vertical sidewalls of the vertical fins 103-1 and 103-3 above the ILD 116. The top spacer 118 may be formed of similar materials and with similar sizing as that described above with respect to bottom spacer 110.

Top source/drain regions 120-1 and 120-2 (collectively, top source/drain regions 120) of the lower VTFETs are formed over the top spacer 118 and surround the remaining portion of the vertical sidewalls of the vertical fins 103-1 and 103-3. The top source/drain regions 120 may be formed of similar materials and with similar processing as that described above with respect to bottom source/drain regions 106. The top source/drain regions 120 may have a height or vertical thickness (in direction Z) in the range of 10 to 30 nm, and may have a width or horizontal thickness (in direction Y) in the range of 5 to 15 nm.

A sacrificial layer 122 is formed on top spacer 118 adjacent top source/drain regions 120-1 and 120-2. The sacrificial material of the sacrificial layer 122 comprises a material that may be etched selective from silicon and nitride materials. For example, the sacrificial material of the sacrificial layer 122 may comprise a material such as, e.g., a silicon oxide, a silicon germanium alloy, an amorphous germanium, or other material that can be etched selective to silicon and nitride materials. The sacrificial layer 122 may be formed, for example, by depositing a sacrificial material across the structure using a directional deposition technique such as, e.g., a physical vapor deposition (PVD) process, a high density plasma (HDP) chemical vapor deposition (CVD) process (HDPCVD), or other similar processes. In one embodiment, the parameters of the HDP deposition are tuned to achieve a directional deposition of sacrificial material wherein the deposition rate of the sacrificial material on horizontal surfaces is greater than the deposition rate of sacrificial material on vertical surfaces. An etch back process is performed to remove sacrificial material on the vertical surfaces. By way of example only, a HDPCVD or physical vapor deposition (PVD) process can be used for directional film deposition, and an isotropic etch that is selective to the sacrificial material can be used to remove the (thinner) sacrificial material that is deposited on the vertical surfaces.

Figure 2:
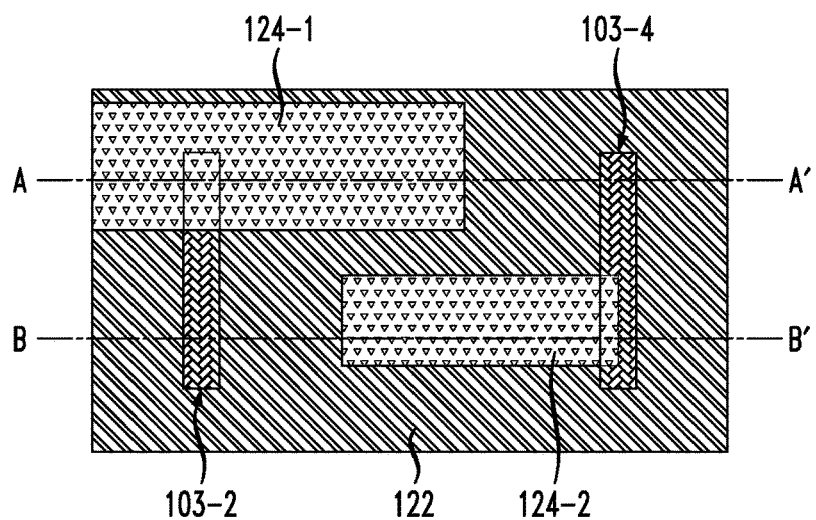
FIG. 2 depicts a top down view of the structure of FIG. 1 following formation of a first masking layer, according to an embodiment of the invention.
Figure 3:
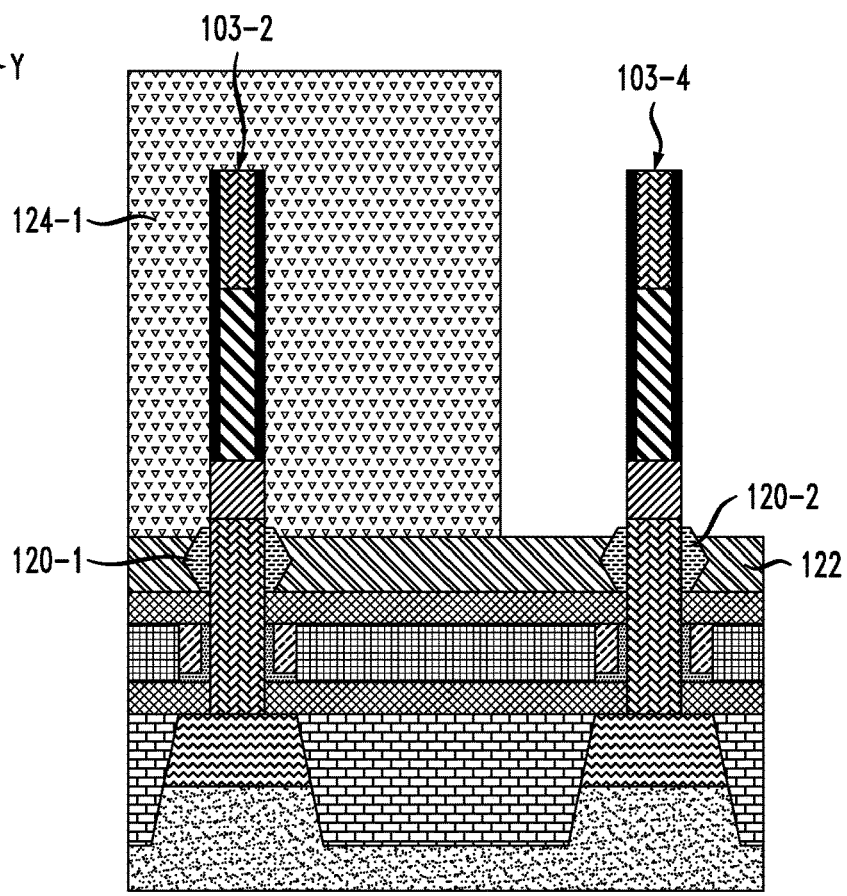
FIG. 3 depicts a cross-sectional view of the structure of FIG. 2 along section line A-A', according to an embodiment of the invention.
Figure 4:
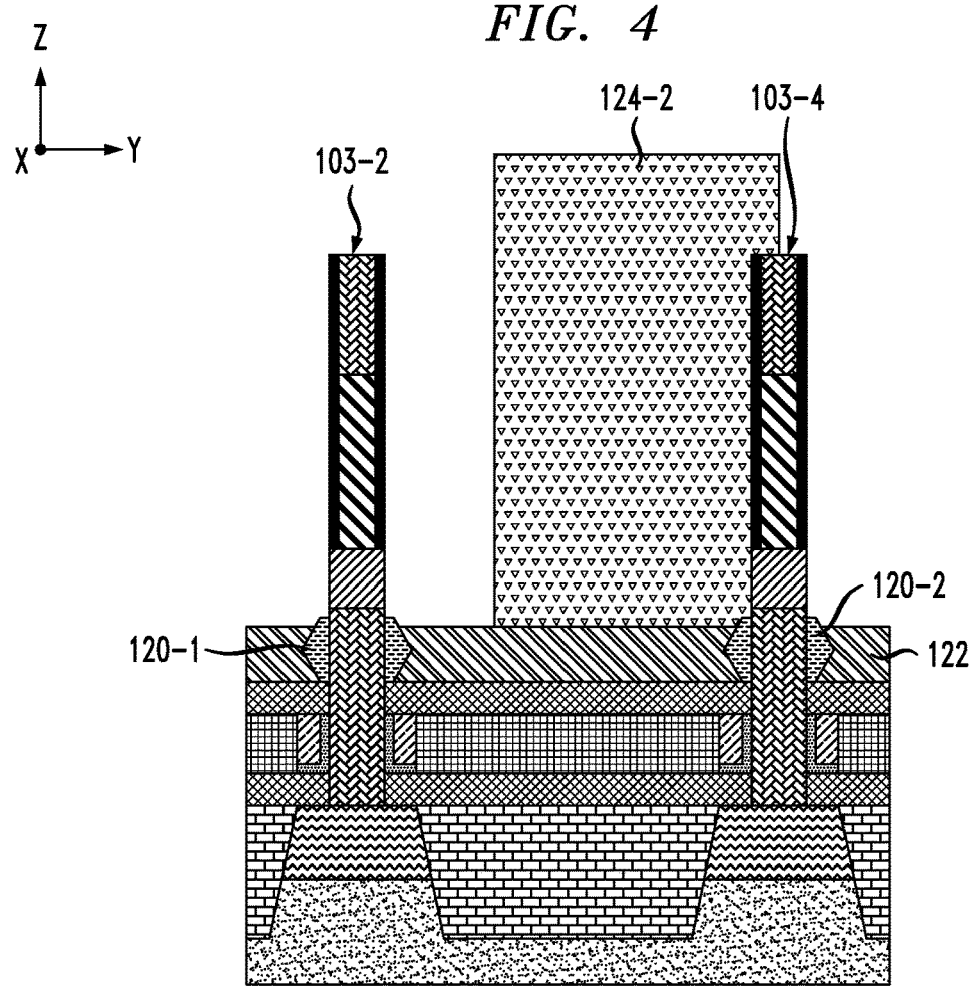
FIG. 4 depicts a cross-sectional view of the structure of FIG. 2 along section line B-B', according to an embodiment of the invention.

FIG. 2 shows a top-down view and FIGS. 3 and 4 show cross-sectional views of the FIG. 1 structure following formation of organic planarizing layers (OPL) 124-1 and 124-2 (collectively OPL 124) on sacrificial layer 122. FIG. 2 is a top-down view in the X-Y plane, FIG. 3 is a cross-sectional view in the Z-Y plane along section line A-A' of FIG. 2, and FIG. 4 is a cross-sectional view in the Z-Y plane along section line B-B' of FIG. 2. The OPL 124 is formed over the sacrificial layer 122 using known organic materials and techniques. For example, the OPL 124 may comprise a resin material that is applied by spin coating and baked to enhance planarization. In some embodiments, the OPL 124 may comprise a liquid monomer that is applied by spin coating and photochemically hardened. The OPL 124 may be patterned using lithographic techniques.

As can be seen in FIGS. 2 and 3, for example, OPL 124-1 may be patterned to form an etch mask over a portion of fins 103-1 and 103-2 near section line A-A' but not the portion of fins 103-3 and 103-4 near section A-A'. In addition, OPL 124-1 does not form an etch mask over a portion of fins 103-1 and 103-2 and fins 103-3 and 103-4 near section line B-B'.

As can be seen in FIGS. 2 and 4, for example, OPL 124-2 may be patterned to form an etch mask over a portion of fins 103-3 and 103-3 near section line B-B' but not the portion of fins 103-1 and 103-2 near section A-A'. In addition, OPL 124-2 does not form an etch mask over a portion of fins 103-3 and 103-4 and fins 103-1 and 103-2 near section line A-A'.

As seen in FIG. 2, in some embodiments, OPL 124-1 and OPL 124-2 are patterned in rectangular shapes which are transferred to sacrificial layers 122. The rectangular shape provides an ease of use in lithographic patterning and a simplicity in the masking process. In some embodiments, for example, the use of an EPI-based extremely low resistance source/drain material for source/drain regions 120-1 and 120-2 reduces the contact area that is required for later metallization such that only a portion of the source/drain regions 120-1 and 120-2 along the length of the fins 103-1 and 103-3 need be contacted instead of the entire length of the fins. The use of the patterned rectangular shapes provides for better control of the contact area of the source/drain regions 120-1 and 120-2.

Figure 5:
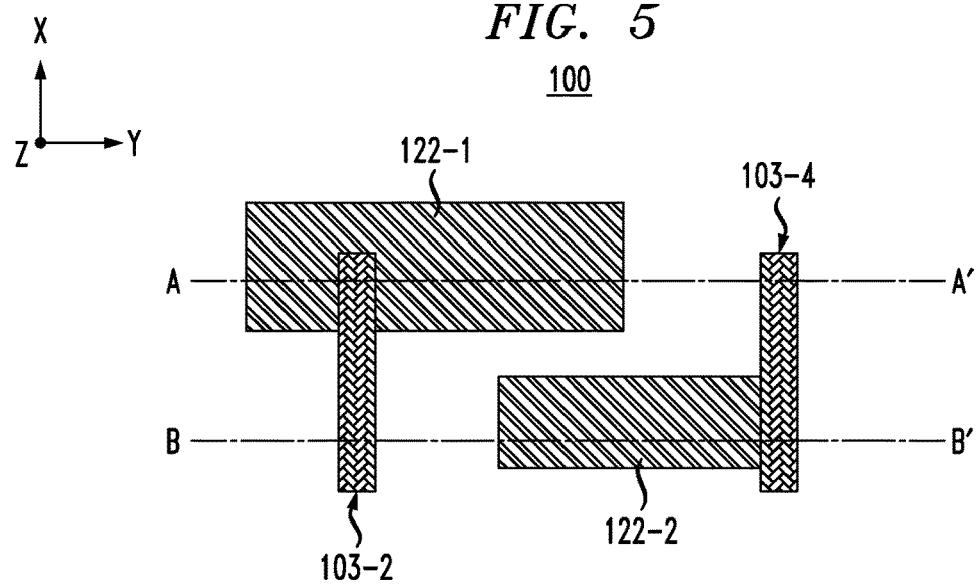
FIG. 5 depicts a top down view of the structure of FIG. 2 following a patterning of a first sacrificial layer using the first masking layer and removal of the masking layer, according to an embodiment of the invention.
Figure 6:
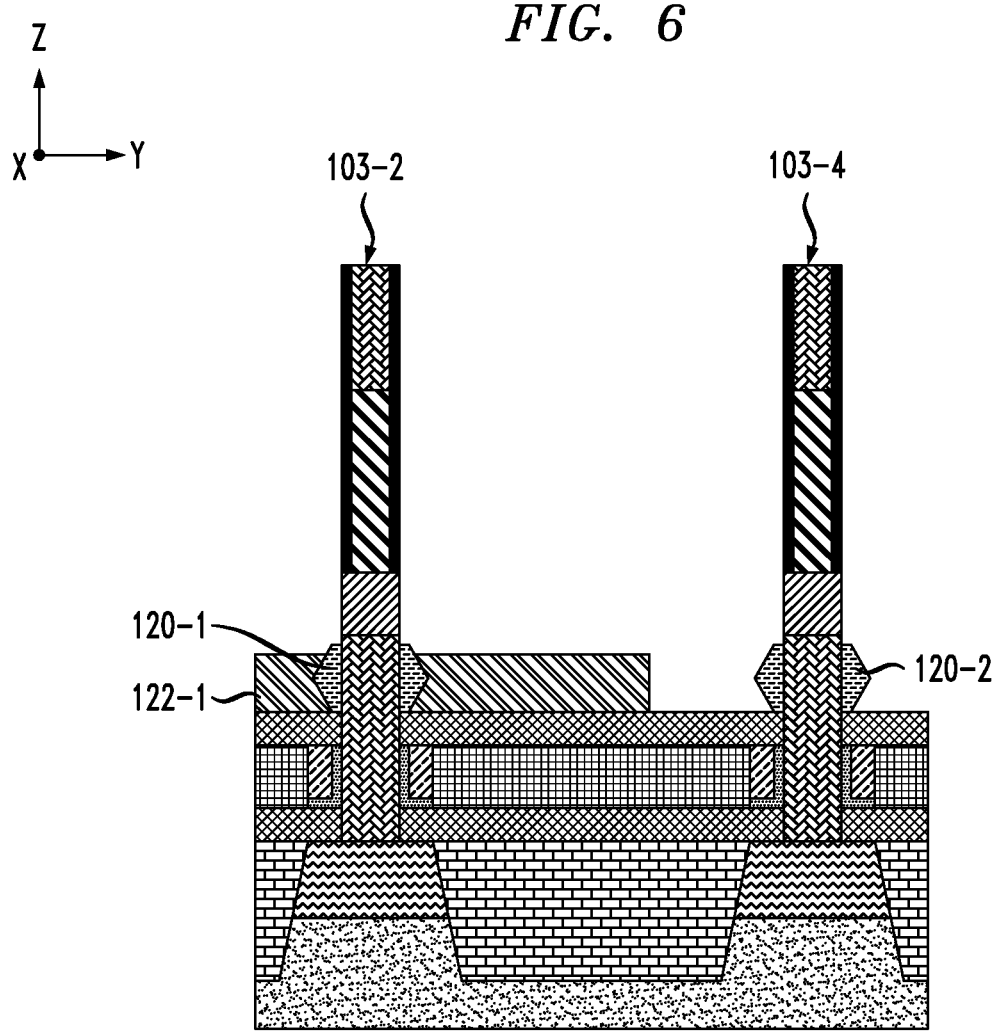
FIG. 6 depicts a cross-sectional view of the structure of FIG. 5 along section line A-A', according to an embodiment of the invention.
Figure 7:
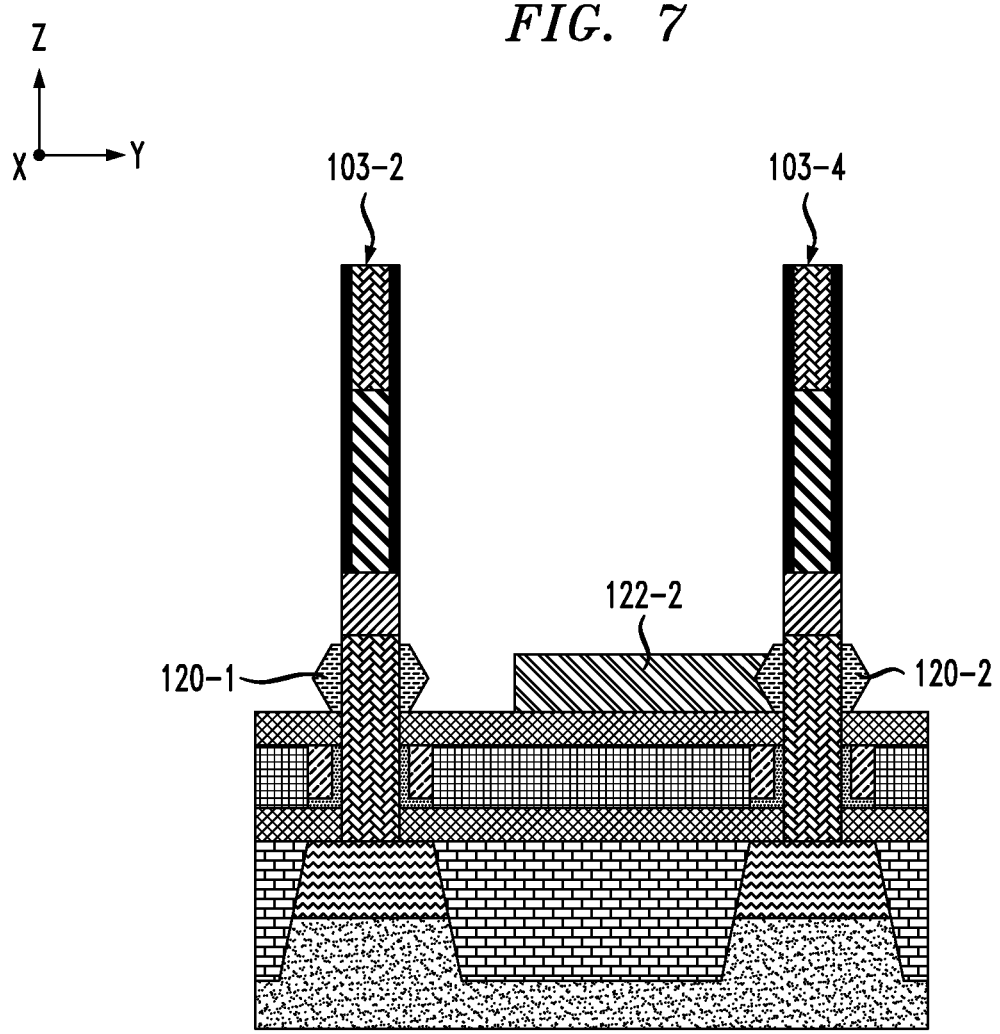
FIG. 7 depicts a cross-sectional view of the structure of FIG. 5 along section line B-B', according to an embodiment of the invention.

FIG. 5 shows a top-down view and FIGS. 6 and 7 show cross-sectional views of the structure of FIGS. 2-4 following an etching process that has etched the exposed portions of sacrificial layer 122 according to the etch mask pattern of OPL 124-1 and OPL 124-2 to form sacrificial layers 122-1 and 122-2. The etching process may be selective to the OPL 124, top source/drain regions 120-1 and 120-2, and top spacer 118. As will be described in further detail below, the sacrificial layers 122-1 and 122-2 are removed during later processing to form a contact to the top source/drain regions 120-1 and 120-2. For example, the top source/drain region 120-1 of the fin 103-1 will be contacted along section line A-A' while the top source/drain region 120-2 of the fin 103-3 will be contacted along section line B-B'.

Figure 8:
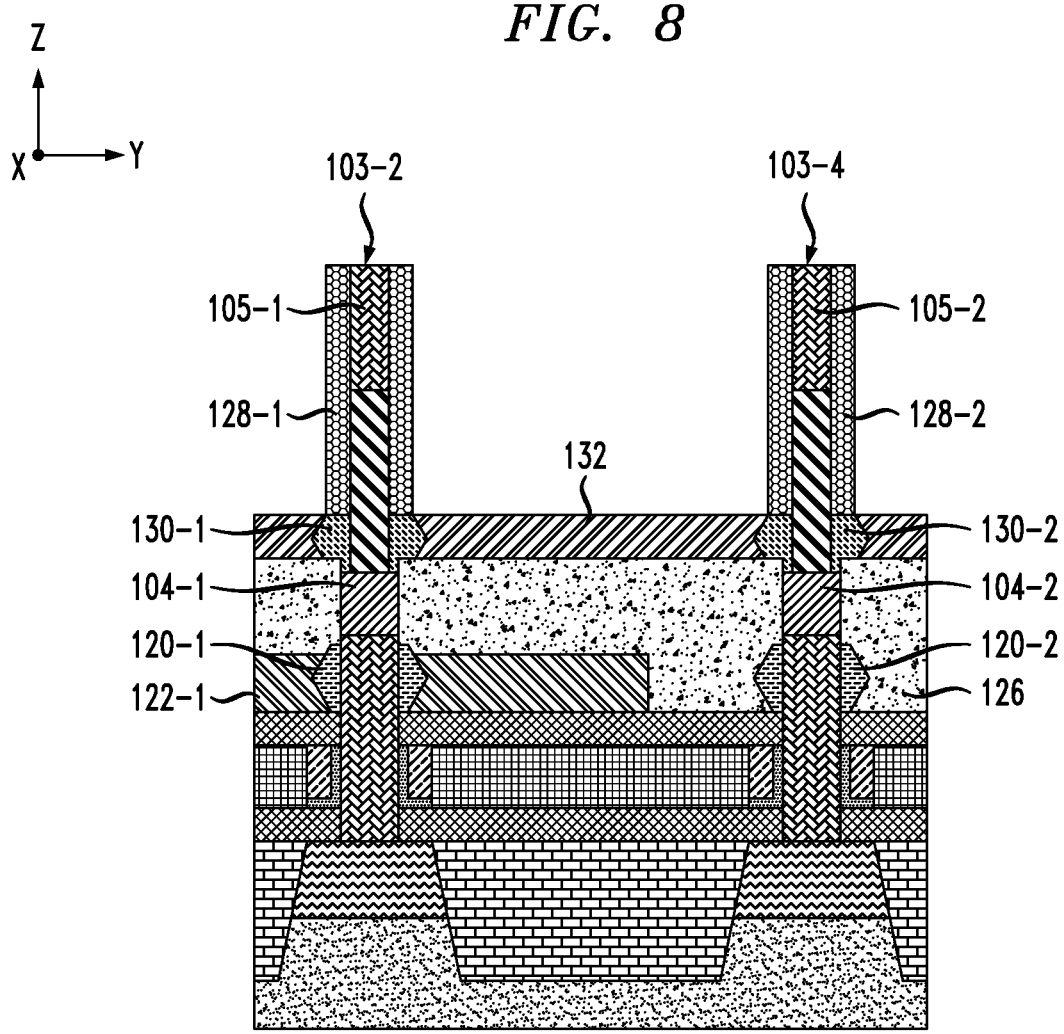
FIG. 8 depicts a cross-sectional view of the structure of FIG. 6 following the formation of an ILD layer and a second sacrificial layer, according to an embodiment of the invention.
Figure 9:
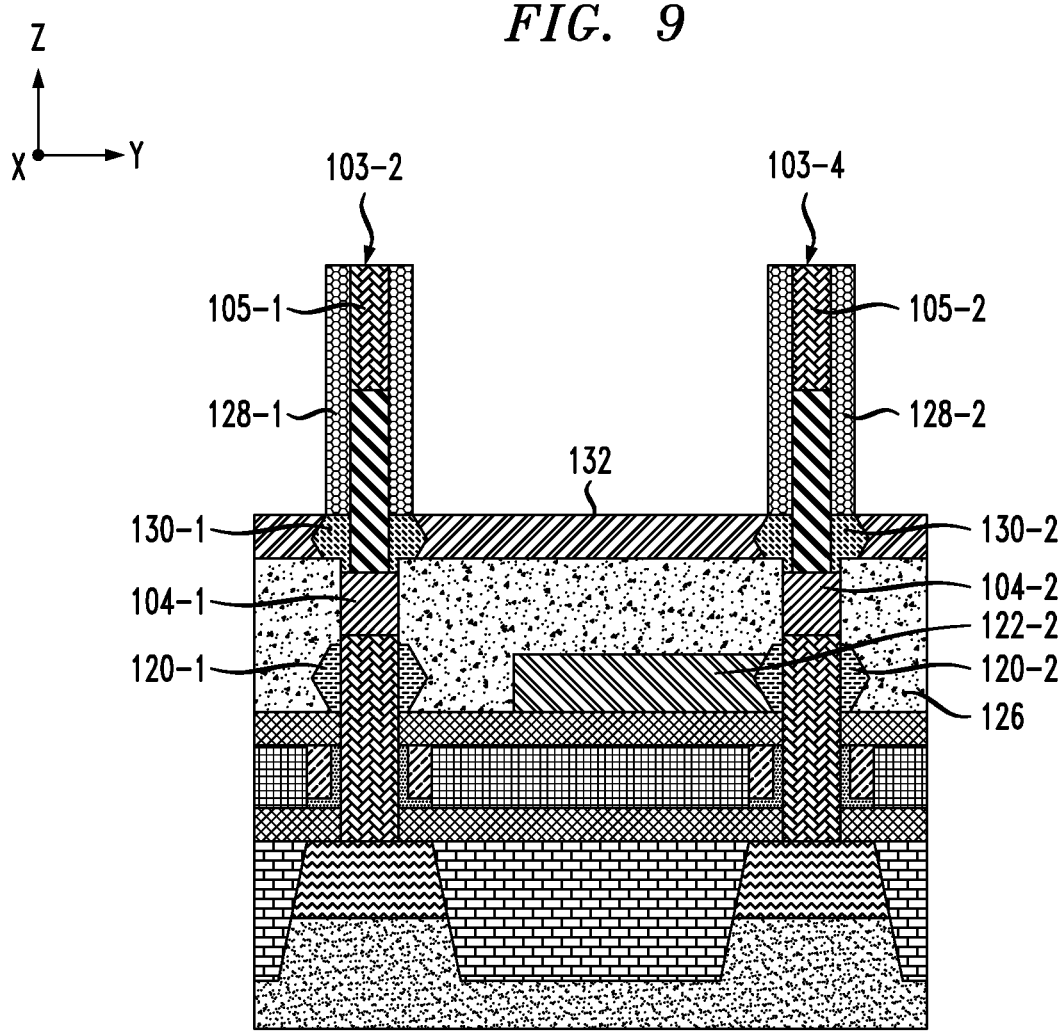
FIG. 9 depicts a cross-sectional view of the structure of FIG. 7 following the formation of the ILD layer and the second sacrificial layer, according to an embodiment of the invention.

FIGS. 8 and 9 show cross-sectional views of the structure of FIGS. 5-7 following formation of an ILD layer 126 surrounding the top source/drain regions 120, sacrificial layers 122-1 and 122-2, and insulating layer 104; the removal of sidewall spacers 107 (FIG. 1); the formation of a temporary oxide layer (not shown) on the ILD layer 126 adjacent fins 103-2 and 103-4; the formation of sidewall spacers 128 on the vertical surfaces of the fins 103-2 and 103-4 above the temporary oxide layer; the removal of the temporary oxide layer; the formation of bottom source/drain regions 130-1 and 130-2 (collectively 130) over the ILD layer 126 adjacent the portions of fins 103-2 and 103-4 exposed by removal of the temporary oxide layer; and the formation of a sacrificial layer 132 on the ILD layer 126 adjacent the bottom source/drain regions 128. FIG. 8 is a cross-sectional view along section line A-A' and FIG. 9 is a cross-sectional view along section line B-B'.

The ILD layer 126 may be formed of similar materials and in a similar manner as described above with respect to ILD 116, and may have a height or vertical thickness (in direction Z) in the range of 20 to 40 nm.

The temporary oxide layer (not shown) is formed using well known materials and techniques. For example, the temporary oxide layer may be deposited using any of the above described deposition techniques to a predetermined thickness.

A dielectric layer is deposited on the exposed surfaces of fins 103-2 and 103-4, hardmask layers 105-1 and 105-2, and the temporary oxide layer, and portions of the dielectric layer are removed to form sidewall spacers 128-1 and 128-2 (collectively 128) from the material remaining on the vertical surfaces of each of the fins 103-2 and 103-4 and hardmask layers 105-1 and 105-2. For example, horizontal portions of the dielectric layer are removed in an RIE process. The RIE process can be performed using, for example, $CH_4$, $CHF_3$, or $CH_2F_2$ chemistry. In accordance with an embodiment of the present invention, the dielectric layer comprises for example, SiN, silicon boron nitride (SiBN), siliconborocarbonitride (SiBCN) or some other dielectric, and has a thickness of about 2 nm to about 10 nm. The temporary oxide layer is then removed, for example, using an etching process selective to the sidewall spacers 128, hardmask layers 105, and ILD layer 126 to expose the surface of ILD layer 126 and portions of the vertical sidewalls of the vertical fins 103-2 and 103-4.

The bottom source/drain regions 130-1 and 130-2 (collectively 130) are formed over the ILD layer 126 and surrounding the portions of the vertical sidewalls of the vertical fins 103-2 and 103-4. The bottom source/drain regions 130 may be formed of similar materials and with similar processing as that described above with respect to bottom source/drain regions 106. The bottom source/drain regions 130 may have a height or vertical thickness (in direction Z) in the range of 10 to 30 nm, and may have a width or horizontal thickness (in direction Y) in the range of 5 to 15 nm.

Sacrificial layer 132 is formed over ILD layer 126 adjacent bottom source/drain regions 130-1 and 130-2. The sacrificial layer 132 may be formed of similar materials and with similar processing as that described above with respect to sacrificial layer 122 and may have a thickness similar to that of bottom source/drain regions 130.

Figure 12:
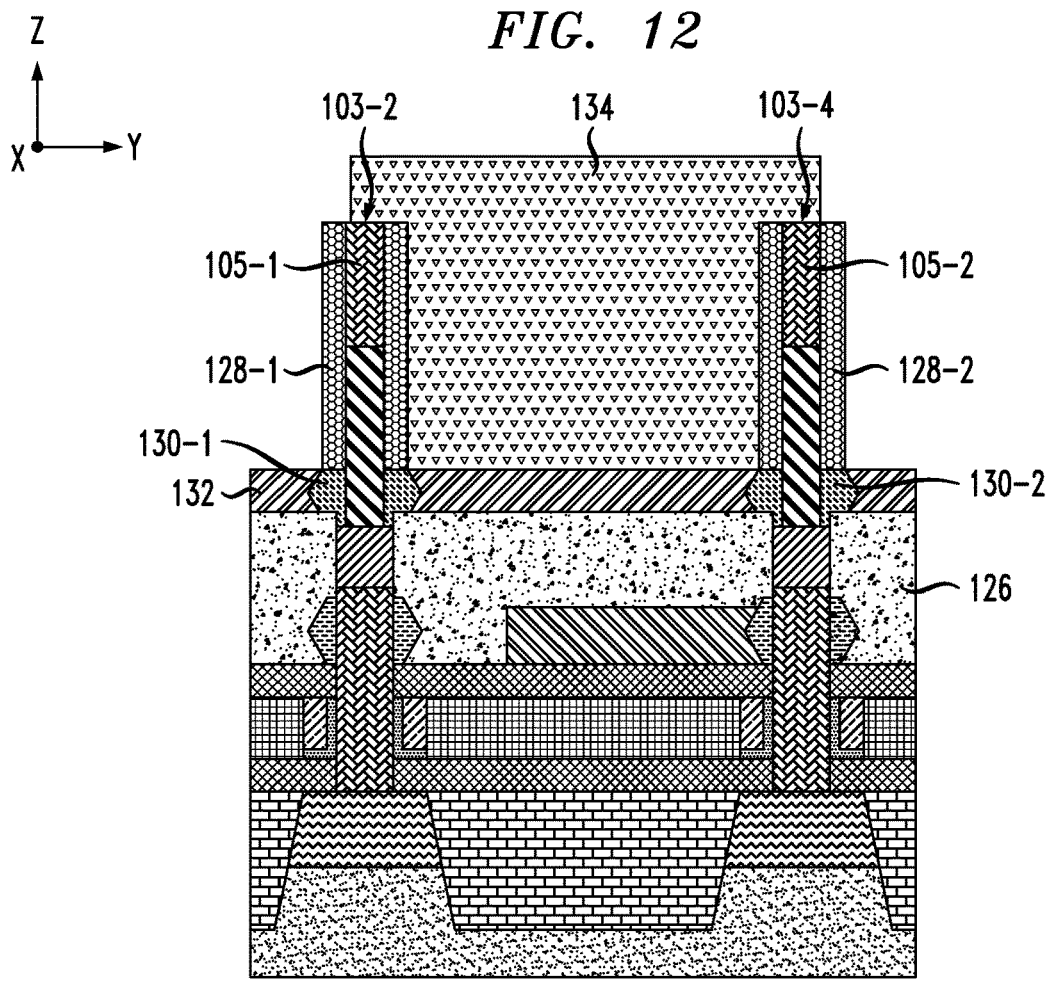
FIG. 12 depicts a cross-sectional view of the structure of FIG. 10 along section line B-B', according to an embodiment of the invention.

FIG. 10 shows a top-down view and FIGS. 11 and 12 show cross-sectional views of the structure of FIGS. 8 and 9 following formation of an OPL 134 on sacrificial layer 132. FIG. 10 is a top-down view in the X-Y plane, FIG. 11 is a cross-sectional view in the Z-Y plane along section line A-A', and FIG. 12 is a cross-sectional view in the Z-Y plane along section line B-B'. The OPL 134 is formed over the sacrificial layer 132 and patterned using known organic materials and techniques similar to that described above with respect to OPL 124.

As can be seen in FIGS. 11 and 12, for example, OPL 134 may be patterned to form an etch mask over a portion of fins 103-1 and 103-2 near section line B-B' and over a portion of fins 103-3 and 103-4 near section B-B' but not over a portion of fins 103-1, 103-2, 103-3, and 103-4 near section line A-A'. For example, as seen in FIGS. 10 and 12, OPL 134 extends between fin 103-2 to fin 103-4 along section line the B-B'. As seen in FIG. 10, in some embodiments, OPL 134 is patterned in a rectangular shape which is transferred to sacrificial layer 132, similar to OPL 124.

Figure 13:
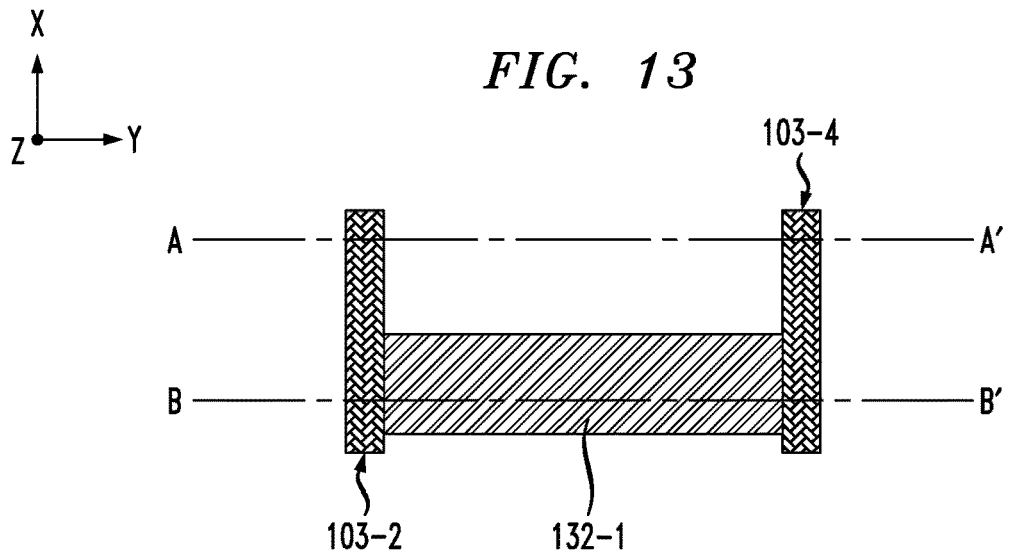
FIG. 13 depicts a top down view of the structure of FIG. 10 following a patterning of the second sacrificial layer using the second masking layer and removal of the second masking layer, according to an embodiment of the invention.
Figure 14:
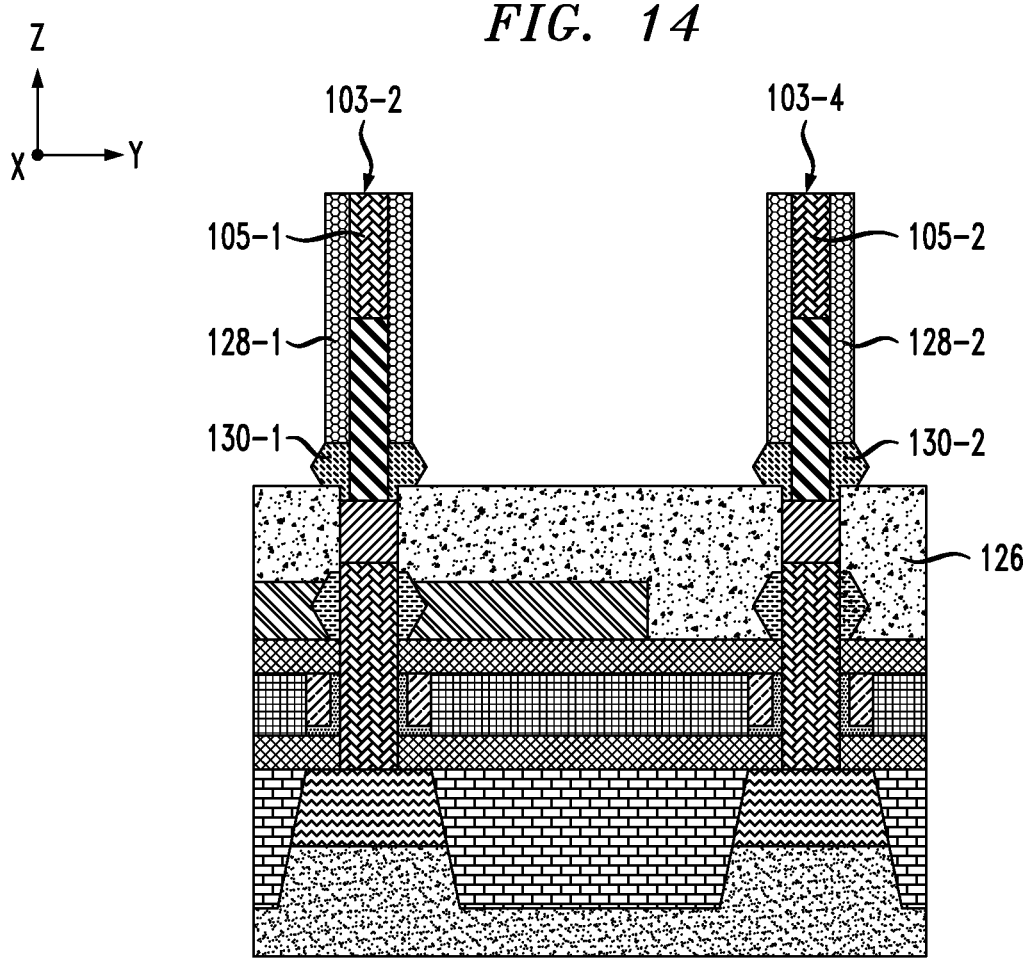
FIG. 14 depicts a cross-sectional view of the structure of FIG. 13 along section line A-A', according to an embodiment of the invention.
Figure 15:
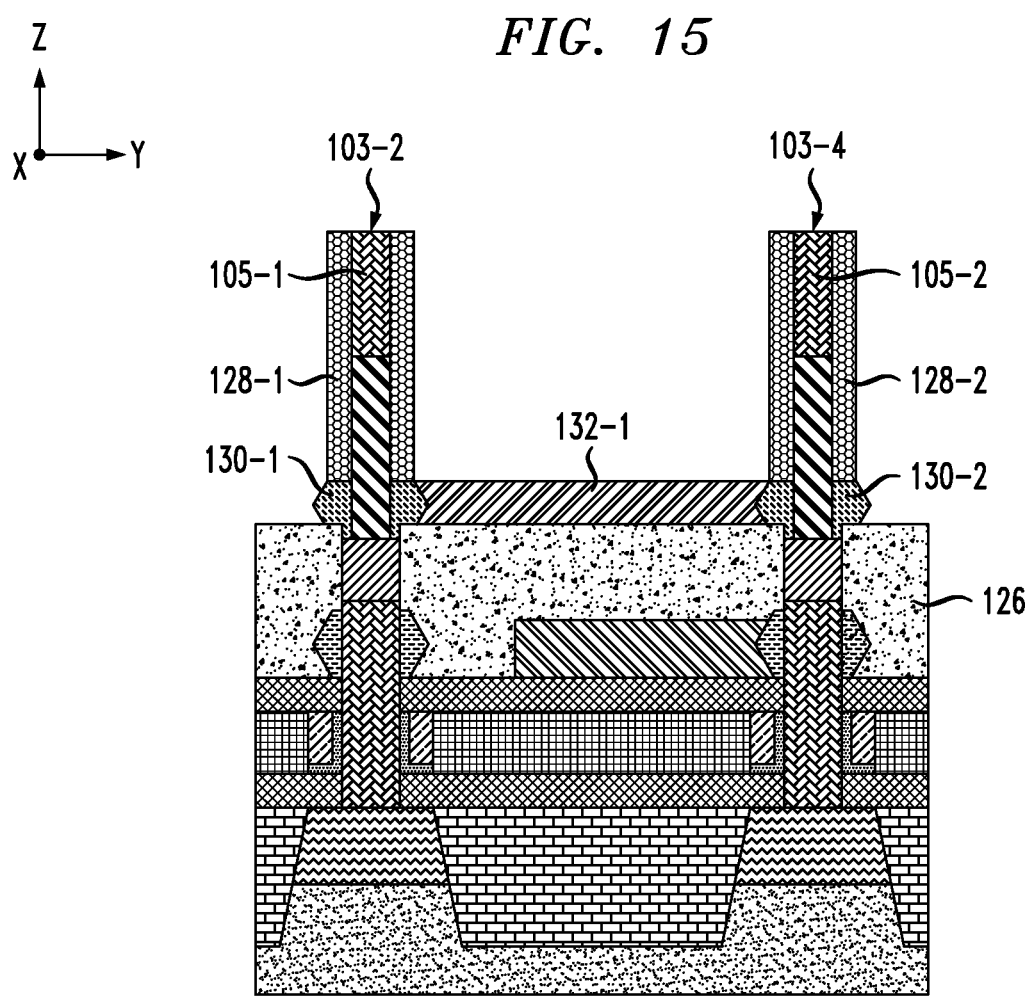
FIG. 15 depicts a cross-sectional view of the structure of FIG. 13 along section line B-B', according to an embodiment of the invention.

FIG. 13 shows a top-down view and FIGS. 14 and 15 show cross-sectional views of the structure of FIGS. 10-12 following an etching process that has etched the exposed portions of sacrificial layer 132 according to the etch mask pattern of OPL 134 to form a sacrificial layer 132-1. The etching process may be selective to the OPL 134, bottom source/drain regions 130-1 and 130-2, and ILD layer 126. As will be described in further detail below, the sacrificial layer 132-1 is removed during later processing to form a contact to the bottom source/drain regions 130-1 and 130-2. For example, as can be seen in FIGS. 13 and 15, the bottom source/drain region 130-1 of the fin 103-2 and bottom source/drain region 130-2 of the fin 103-4 will be connected by contact material along section line B-B'.

Figure 16:
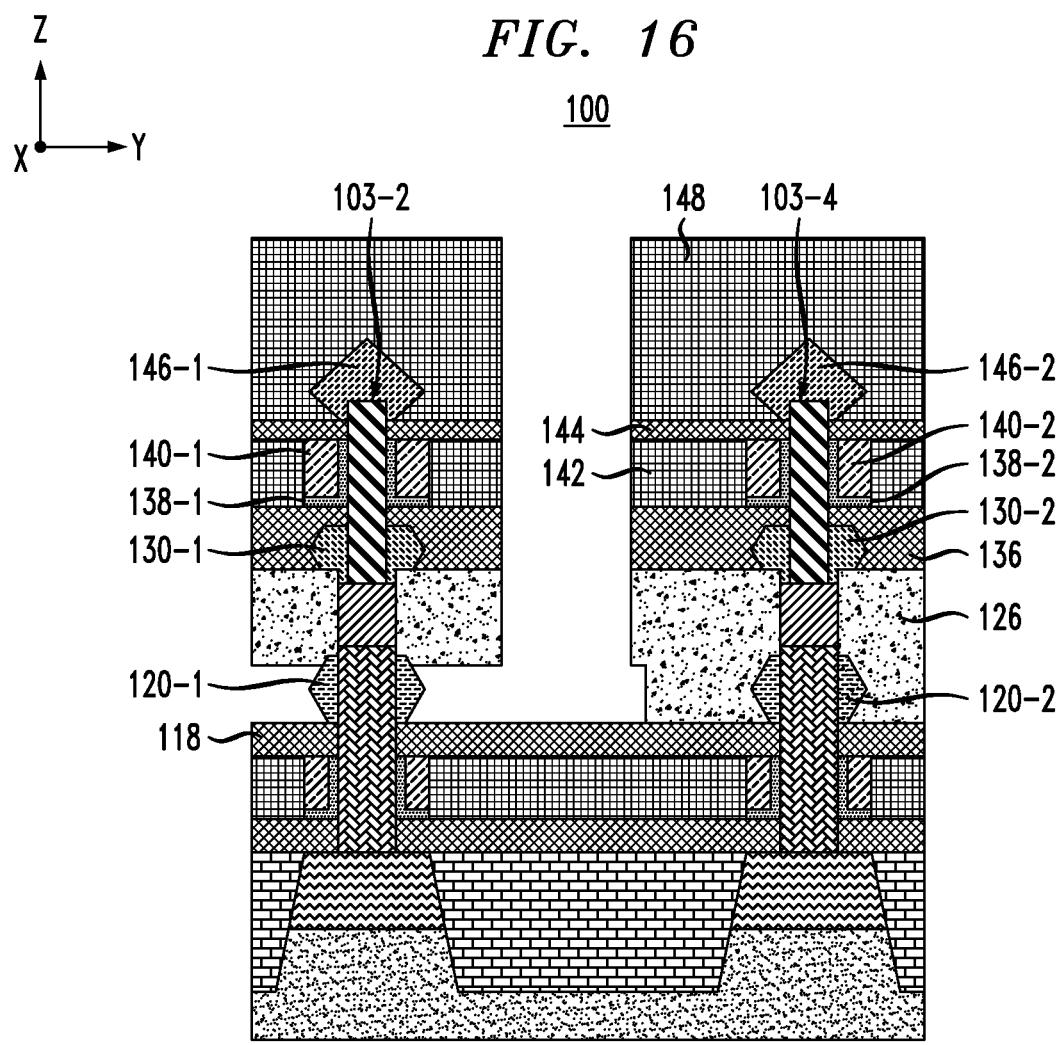
FIG. 16 depicts a cross-sectional view of the structure of FIG. 14 following the formation of spacer layers, ILD layers, gate structures and etching and removal of the first and second sacrificial layers, according to an embodiment of the invention.
Figure 17:
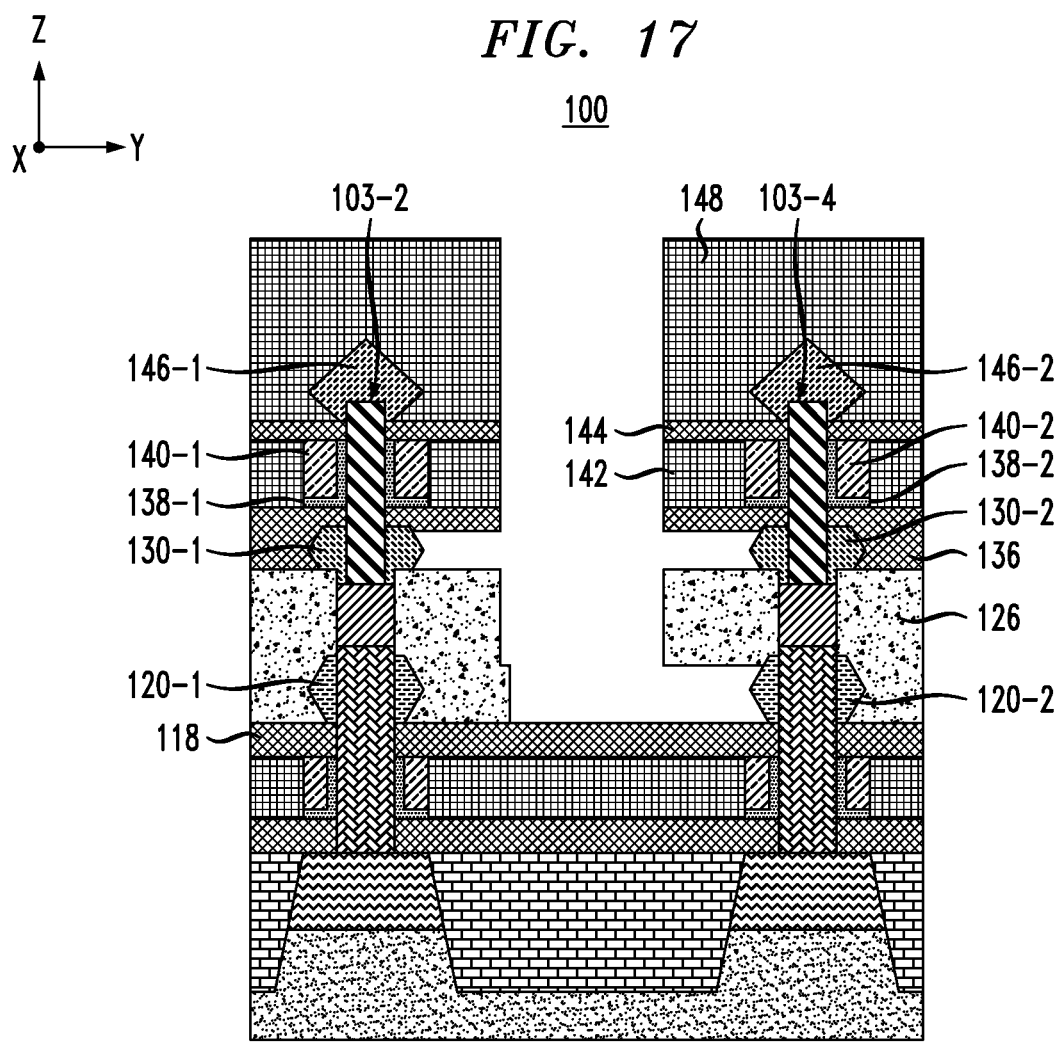
FIG. 17 depicts a cross-sectional view of the structure of FIG. 15 following the formation of spacer layers, ILD layers, gate structures and etching and removal of the first and second sacrificial layers, according to an embodiment of the invention.

FIGS. 16 and 17 show cross-sectional views of the structure of FIGS. 13-15 following the removal of sidewall spacers 128 and hardmask layers 105; the formation of a bottom spacer 136 surrounding bottom source/drain regions 130 and sacrificial layer 132-1; the formation of the gate stack for the upper VTFETs; the formation of ILD 142; the formation of top spacer 144; the formation of top source/drain regions 146-1 and 146-2; the formation of ILD 148; patterning a mask layer over the top surface of the ILD 148; and exposing a portion of the ILD 148 followed by RIE or other suitable processing to remove exposed portions of the ILD layer 148, top spacer 144, ILD layer 142, sacrificial layer 132-1, bottom spacer 136, ILD 126 and sacrificial layers 122-1 and 122-2.

Sidewall spacers 128 and hardmask layers 105 may be removed using a planarizing process such as, e.g., CMP, or a selective etching process that is selective to ILD layer 126, bottom source/drain regions 130, and sacrificial layer 132.

Bottom spacer 136 is formed surrounding the bottom source/drain regions 130 and a portion of the vertical sidewalls of the vertical fins 103-2 and 103-4 above top surface of the bottom source/drain regions 130. The bottom spacer 136 may be formed of similar materials as the bottom spacer 110. The bottom spacer 136 may have a height or vertical thickness (in direction Z) in the range of 10 to 30 nm, provided that the bottom spacer 136 must be formed with a greater height than that of the bottom source/drain regions 130 so as to provide a buffer between the bottom source/drain regions 130 and the gate stack of the upper VTFETs.

The gate stack for the upper VTFETs is formed surrounding a portion of the vertical sidewalls of the vertical fins 103-2 and 103-4 above the bottom spacer 136. The gate stack for the upper VTFETs, similar to the gate stack for the lower VTFETs, includes gate dielectric layers 138-1 and 138-2 (collectively, gate dielectric layers 138) and gate conductor layers 140-1 and 140-2 (collectively, gate conductor layers 140). The gate dielectric layers 138 and gate conductor layers 140 may be formed of similar materials, with similar processing and similar sizing as that described above with respect to the gate dielectric layers 112 and gate conductor layers 114 of the lower VTFETs.

Although not shown in FIG. 1, an interfacial layer may be formed between the gate stacks and the sidewalls of the vertical fins 103. The interfacial layer may be formed of $SiO_2$ or another suitable material such as silicon oxynitride ($SiO_xN_y$). The interfacial layer may have a width or horizontal thickness (in direction Y) ranging from 0.5 nm to 1.5 nm.

ILD 142 is formed surrounding the gate stack of the upper VTFETs. The ILD 142 may be formed of similar materials as that described above with respect to the ILD 116.

Top spacer 144 for the upper VTFETs is formed over the gate stack and ILD 142 surrounding portions of sidewalls of the vertical fins 103-2 and 103-4. The top spacer 144 may be formed of similar materials as the bottom spacer 110. The top spacer 144 may have a height or vertical thickness (in direction Z) in the range of 10 to 30 nm.

Top source/drain regions 146-1 and 146-2 (collectively, top source/drain regions 146) are formed over the top surfaces of the vertical fins 103-2 and 103-4 as shown. The top source/drain regions 146 may be formed of similar materials and using similar processing as that described above with respect to bottom source/drain regions 106. The top source/drain regions 146 may have a height or vertical thickness (in direction Z) in the range of 10 to 30 nm, and may have a width or horizontal thickness (in direction Y) in the range of 10 to 30 nm.

ILD 148 is formed surrounding the top source/drain regions 146. The ILD 148 may be formed of similar materials as those described above with respect to the ILD 116. As shown in FIGS. 16 and 17, the ILD 148 overfills the structure, and has a height or vertical thickness (in direction Z) that exceeds the top surfaces of the top source/drain regions 146, such as a height or vertical thickness in the range of 30 to 70 nm.

A mask layer is patterned over the top surface of the ILD 148, exposing portions of the ILD 148 corresponding to portions of sacrificial layers 132-1, 122-1, and 122-2, followed by ME or other suitable processing to remove exposed portions of the ILD layer 148, top spacer 144, ILD layer 142, sacrificial layer 132-1, bottom spacer 136, ILD 126 and the upper surfaces of sacrificial layers 122-1 and 122-2. For example, a first channel may be formed by the RIE process that exposes the upper surface of sacrificial layer 122-1 and a second channel, separate from the first channel, may be formed by the ME process that exposes sacrificial layer 132-1 and the upper surface of sacrificial layer 122-2. The remaining portions of the sacrificial layers 132-1, 122-1 and 122-2 are then removed using an etch process that removes the sacrificial material of these layers selective to the materials of the layers 118, 126, 130, 136, 140, 142, 144 and 148. As a result, portions of the top source/drain regions 120 and the bottom source/drain regions 130 are exposed. In some embodiments, for example, the layers 118, 126, 130, 136, 140, 142, 144 and 148 are formed of nitride-based materials or other materials, while the sacrificial material of the sacrificial layers 122-1, 122-2, and 132-1 are oxide-based materials. In such cases, the etch used to remove the remaining portions of the sacrificial layers 122-1, 122-2, and 132-1 may be a selective wet etch, a non-directional dry etch, or other similar etches that may etch oxide-based materials selective to other materials such as nitride-based materials.

Figure 18:
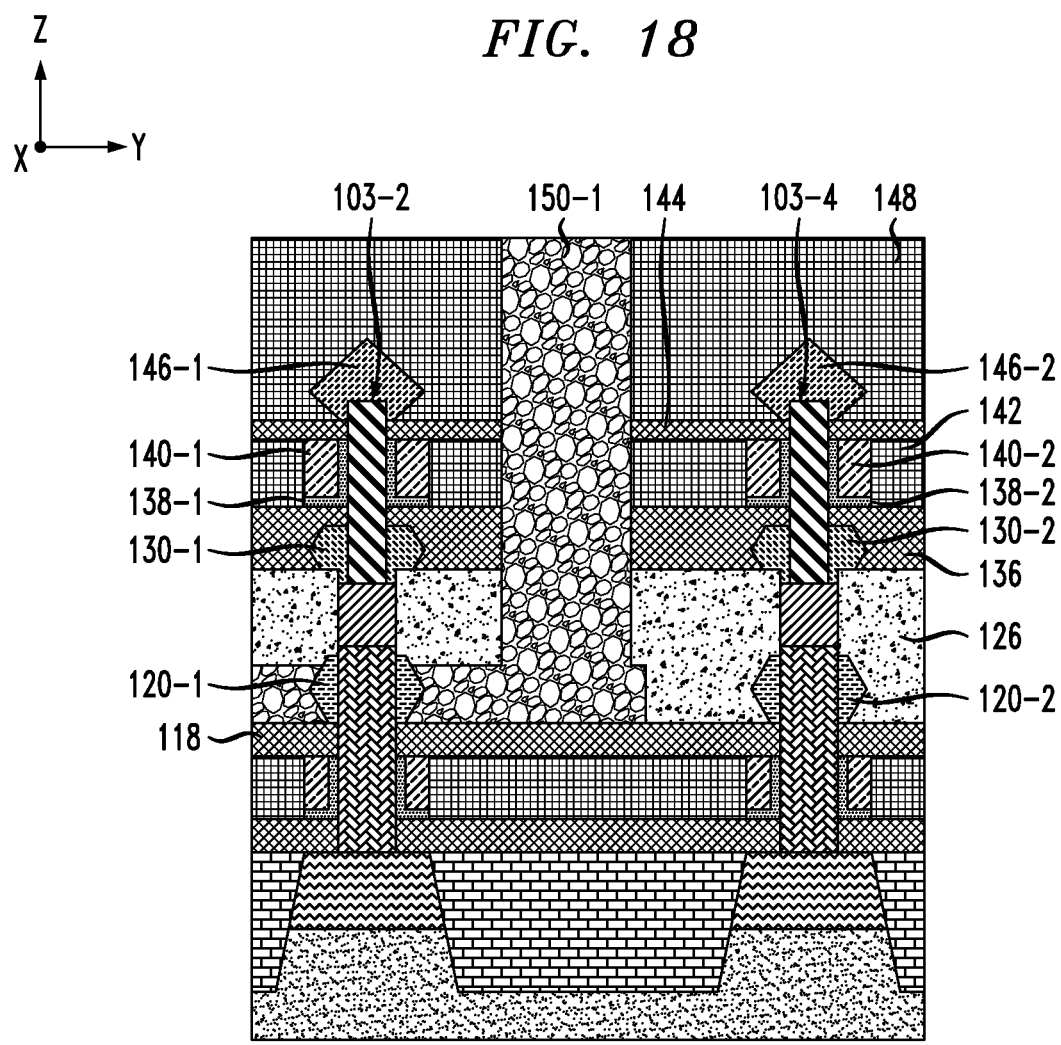
FIG. 18 depicts a cross-sectional view of the structure of FIG. 16 following the formation of a contact material, according to an embodiment of the invention.
Figure 19:
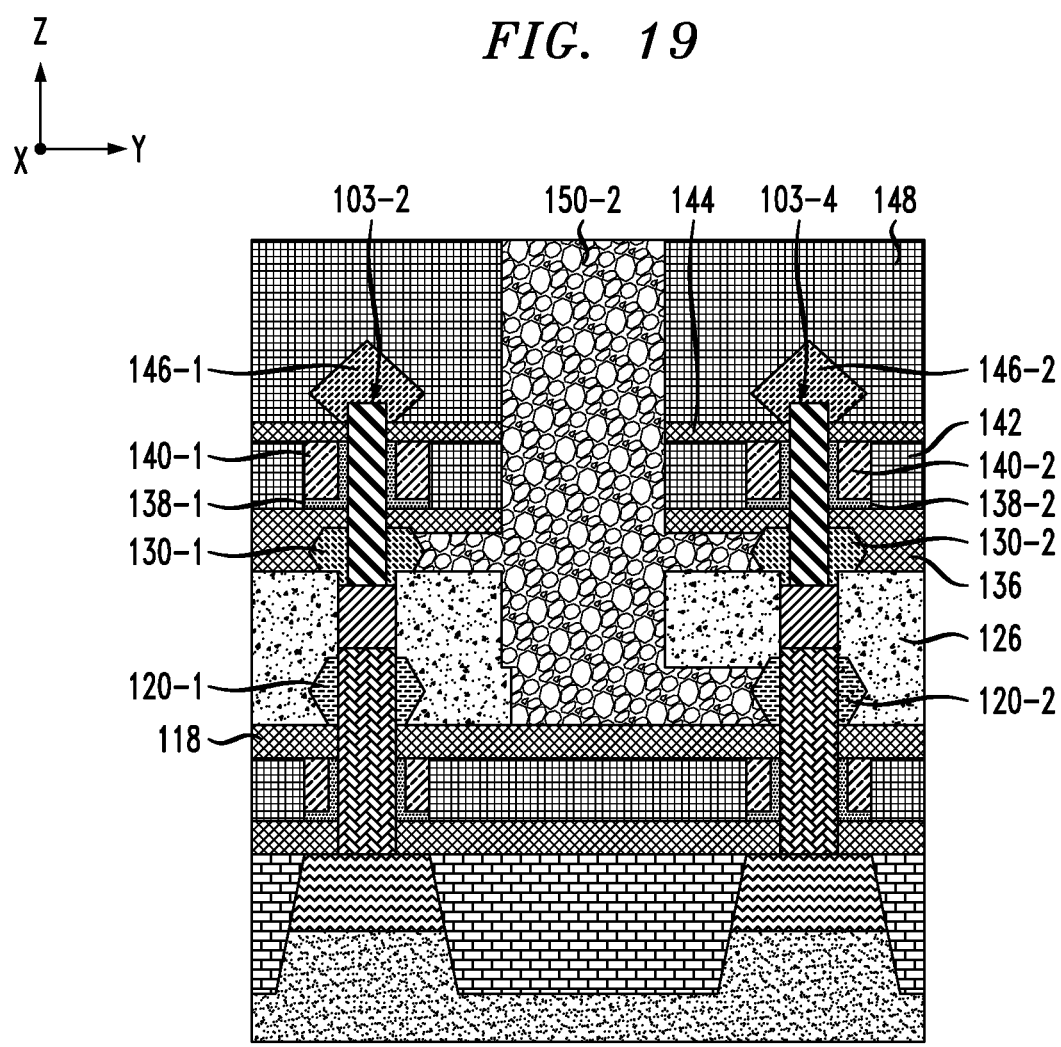
FIG. 19 depicts a cross-sectional view of the structure of FIG. 17 following the formation of a contact material, according to an embodiment of the invention.

FIGS. 18 and 19 show cross-sectional views of the structure of FIGS. 16 and 17 following a fill of the first and second channels with contact material 150-1 and 150-2 (collectively contact material 150), e.g., contact stud metal fill. FIG. 18 is taken along the A-A' cross section of FIGS. 2, 5, and 10. FIG. 19 is taken along the B-B' cross section of FIGS. 2, 5, and 10. The contact material 150 may be tungsten (W), cobalt (Co), or another suitable material. In some embodiments, any overburden contact material may be planarized down to the upper surface of ILD layer 148. As shown in FIG. 18 for example, contact material 150-1 is filled into the first channel to the exposed surface of source/drain region 120-1 forming a metal contact for source/drain region 120-1. As shown in FIG. 19 for example, contact material 150-2 is filled into the second channel to the exposed surfaces of source/drain region 120-2, 130-1 and 130-2 forming a metal contact connecting source/drain regions 120-2, 130-1, and 130-2.

Although FIGS. 1-19 illustrate the formation of shared contacts to the bottom source/drain regions 130-1 and 130-2 of the upper VTFETs and the top source/drain region 120-2 of one of the lower VTFETs, it should be appreciated that similar processing may be used to form contacts to other combinations of the bottom and top source/drain regions of the upper and lower VTFETs of a stacked VTFET structure. Various examples of such alternatives will now be described.

Figure 20:
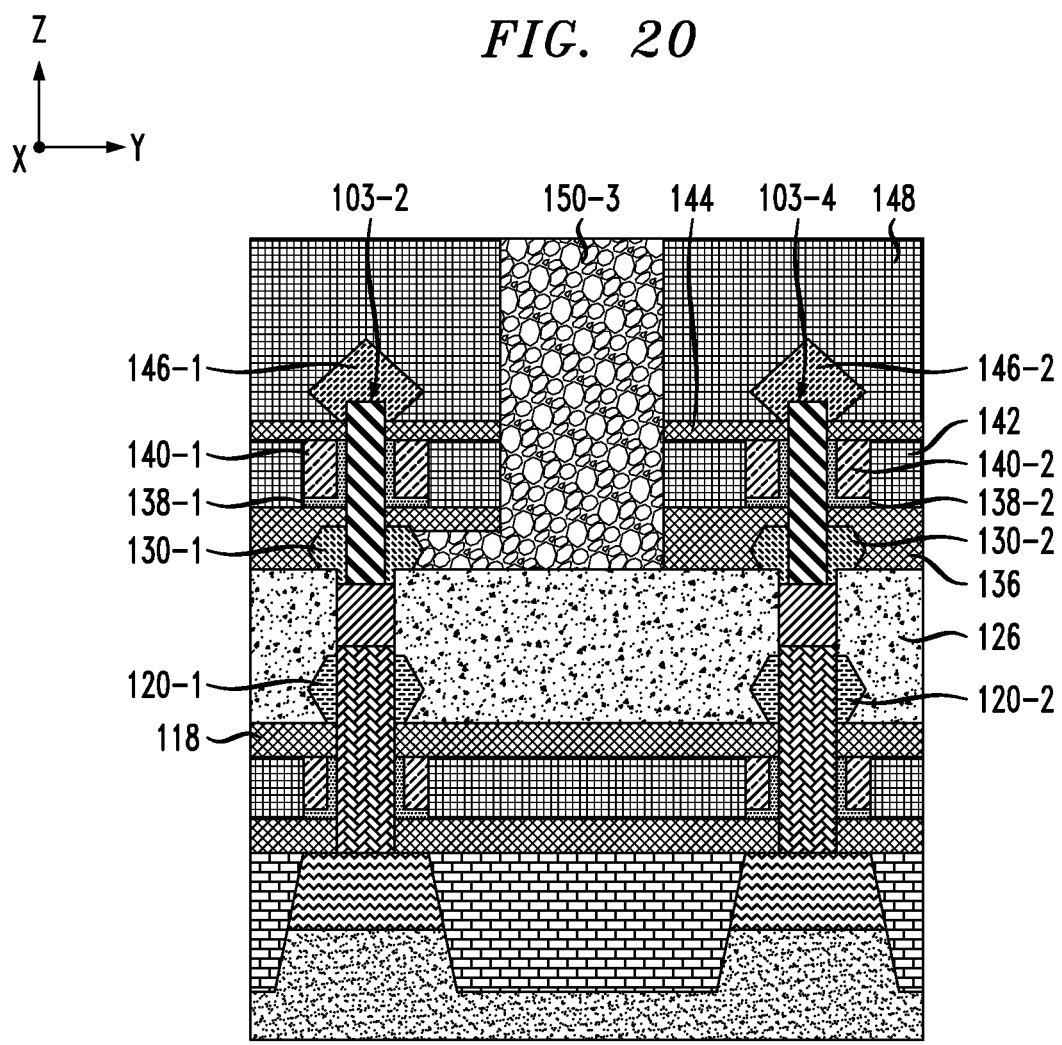
FIG. 20 depicts a cross-sectional view of the structure of FIG. 17 following the formation of a contact material, according to an alternate embodiment of the invention.

FIG. 20 shows a cross-sectional view of the structure of FIGS. 16 and 17 following a fill of a channel with contact material 150-3 according to an alternative embodiment. FIG. 20 is taken along the B-B' cross section of FIGS. 2, 5, and 10. In this embodiment, contact material 150-3 is filled into a channel that exposes only source/drain region 130-1 to form a metal contact for source/drain region 130-1 that is not connected directly to source/drain regions 120-2 and 130-2 via the contact material. For example, in this embodiment, a separate channel may be filled with contact material that forms a metal contact for one or both of source/drain regions 120-2 and 130-2 separate from source/drain region 130-1 along the B-B' cross section of FIGS. 2, 5, and 10.

Again, it should be appreciated that FIGS. 1-20 are presented to show examples of MOL contact formation for stacked VTFET structures. The particular numbers of bottom and top source/drain regions that are contacted in a particular embodiment may vary as desired based on the type of structure that is to be formed. For example, the embodiment of FIGS. 1-19 illustrates the formation of a stacked VTFET having, for example a PFET disposed over an NFET that may form a particular kind of gate such as, e.g., a NAND gate. To form other types of logic gates using stacked VTFET structures, other combinations of the bottom and top source/drain regions of the upper and lower VTFET structures may include shared contacts.

In some VTFET fabrication processes, the metal contact to the source/drain region spans the entire length of the fin and is disposed on both sides of the source/drain region, e.g., wrapping around the source/drain region. One reason for such a configuration is to reduce the parasitic resistance between the source/drain region and the metal contact. For example, a source/drain region formed by dopant diffusion having low resistance required needs to have a larger contact area between the metal contact and the source/drain region.

In illustrative embodiments, an epi-based extremely low resistance source/drain material may be used in the source/drain region that reduces the parasitic resistance between the metal contact and the source/drain region. Because of this, the required contact area between the metal contact and the source/drain region may be reduced. Illustrative embodiments disclose VTFET fabrication processes that reduce the contact area between the source/drain region and the metal contact as compared to the above mentioned VTFET fabrication processes, for example, using the rectangular patterning of sacrificial material as described above. Using this patterning, the metal contact may be formed to make contact with the source/drain region on a single side, instead of wrapping the metal contact around the source/drain region and contacting it on both sides of the fin. In addition, using this patterning, the metal contact may be formed to make contact with only a portion of the length of the fin, e.g., a portion of the length in the X direction, instead of the entire length of the fin. By patterning the sacrificial layer such that the metal contact is later formed on only a portion of the fin, other metal contacts may also be formed which also contact the source/drain region at a different portion or on the other side which provides for increased design capabilities and options when designing the VTFET.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a stacked vertical transport field-effect transistor structure comprising one or more vertical fins each comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;
    forming a sacrificial layer in contact with a source/drain region of the stacked vertical transport field-effect transistor structure;
    forming a masking layer over the sacrificial layer, the masking layer defining a pattern to be patterned into the sacrificial layer;
    patterning the sacrificial layer based on the masking layer to form a patterned sacrificial layer;
    removing the masking layer;
    etching a portion of the stacked vertical transport field-effect transistor structure down to a surface of the patterned sacrificial layer;
    removing the patterned sacrificial layer to form a channel exposing the source/drain region; and
    forming a contact material in the etched portion of the stacked vertical transport field-effect transistor structure and in the channel, the contact material being formed in contact with the exposed source/drain region.

2. The method of claim 1, wherein the sacrificial layer comprises an oxide.

3. The method of claim 1, wherein the sacrificial layer is selectively etchable from silicon and nitride.

4. The method of claim 1, wherein the pattern defined by the masking layer has a rectangular cross-section corresponding to the patterned sacrificial layer.

5. The method of claim 1, wherein forming the sacrificial layer in contact with the source/drain region of the stacked vertical transport field-effect transistor structure comprises forming the sacrificial layer in contact with top source/drain regions of the lower vertical transport field-effect transistor of the one or more vertical fins.

6. The method of claim 5, wherein the pattern defined by the masking layer comprises a first mask pattern and a second mask pattern, wherein the first mask pattern corresponds to a first top source/drain region of a first lower vertical transport field-effect transistor of a first of the vertical fins and wherein the second mask pattern corresponds to a second top source/drain region of a second lower vertical transport field-effect transistor of a second of the vertical fins; and
    wherein patterning the sacrificial layer based on the masking layer comprises patterning a first patterned sacrificial layer based on the first mask pattern and patterning a second patterned sacrificial layer based on the second mask pattern;
    wherein etching a portion of the stacked vertical transport field-effect transistor structure down to a surface of the patterned sacrificial layer comprises etching a first portion of the stacked vertical transport field-effect transistor structure down to a surface of the first patterned sacrificial layer and etching a second portion of the stacked vertical transport field-effect transistor structure down to a surface of the second patterned sacrificial layer.

7. The method of claim 6, further comprising:
    forming a second sacrificial layer in contact with bottom source/drain regions of the upper vertical transport field-effect transistor of the one or more vertical fins;
    forming a second masking layer over the second sacrificial layer, the second masking layer defining a second pattern to be patterned into the second sacrificial layer;
    patterning the second sacrificial layer based on the second masking layer to form a third patterned sacrificial layer;
    removing the second masking layer;
    etching a third portion of the stacked vertical transport field-effect transistor structure down to a surface of the third patterned sacrificial layer;
    removing the third patterned sacrificial layer to form a second channel exposing the bottom source/drain regions; and
    forming a second contact material in the etched third portion of the stacked vertical transport field-effect transistor structure and in the second channel, the second contact material being formed in contact with the exposed bottom source/drain regions.

8. The method of claim 7, wherein the pattern defined by the second masking layer has a rectangular cross-section corresponding to the third patterned sacrificial layer.

9. The method of claim 7, wherein the third patterned sacrificial layer extends between bottom source/drain regions of the upper vertical transport field-effect transistors of a first of the vertical fins and a second of the vertical fins.

10. The method of claim 7, wherein the etching of the second portion of the stacked vertical transport field-effect transistor structure down to the surface of the second patterned sacrificial material and etching the third portion of the stacked vertical transport field-effect transistor structure down to a surface of the third patterned sacrificial layer are performed by the same etching process.

11. The method of claim 10, wherein the second patterned sacrificial material is removed during removal of the third patterned sacrificial layer to form a third channel exposing the second top source/drain region of the second lower vertical transport field-effect transistor of the second vertical fin; and
    wherein forming the second contact material in the etched third portion of the stacked vertical transport field-effect transistor structure and in the second channel comprises forming the second contact material in the etched second portion of the stacked vertical transport field-effect transistor structure and in the third channel, the second contact material being formed in contact with the exposed top source/drain region of the lower vertical transport field-effect transistor of the second vertical fin.

12. A method of forming a semiconductor structure, comprising:
    forming a stacked vertical transport field-effect transistor structure comprising at least a first vertical fin and a second vertical fin, each vertical fin comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;

forming top source/drain regions on the first semiconductor layers of the first and second vertical fins below the isolation layers;

forming a sacrificial layer in contact with the top source/drain regions formed on the first semiconductor layers of the first and second vertical fins and below the isolation layers;

forming a masking layer over the sacrificial layer, the masking layer defining a pattern to be patterned into the sacrificial layer;

patterning the sacrificial layer based on the masking layer to form at least a first patterned sacrificial layer and a second patterned sacrificial layer, the first patterned sacrificial layer being in contact with the top source/drain region formed on the first semiconductor layer of the first vertical fin and the second patterned sacrificial layer being in contact with the top source/drain region formed on the first semiconductor layer of the second vertical fin;

removing the masking layer;

forming an interlayer dielectric layer on the stacked vertical transport field-effect transistor structure, the interlayer dielectric layer isolating the first patterned sacrificial layer from the second patterned sacrificial layer;

etching a first portion of the stacked vertical transport field-effect transistor structure down through the interlayer dielectric layer to expose a surface of the first patterned sacrificial layer;

etching a second portion of the stacked vertical transport field-effect transistor structure down through the interlayer dielectric layer to expose a surface of the second patterned sacrificial layer;

removing the first patterned sacrificial layer to form a first channel exposing the top source/drain region formed on the first semiconductor layer of the first vertical fin;

removing the second patterned sacrificial layer to form a second channel exposing the top source/drain region formed on the first semiconductor layer of the second vertical fin;

forming a first contact material in the etched first portion of the stacked vertical transport field-effect transistor structure and in the first channel, the first contact material being formed in contact with the exposed top source/drain region formed on the first semiconductor layer of the first vertical fin; and forming a second contact material in the etched second portion of the stacked vertical transport field-effect transistor structure and in the second channel, the second contact material being formed in contact with the exposed top source/drain region formed on the first semiconductor layer of the second vertical fin.

13. The method of claim 12, wherein the sacrificial layer comprises an oxide.

14. The method of claim 12, wherein the sacrificial layer is selectively etchable from silicon and nitride.

15. The method of claim 12, wherein the pattern defined by the masking layer comprises a first rectangular cross-section corresponding to the first patterned sacrificial layer and a second rectangular cross-section corresponding to the second patterned sacrificial layer.

16. The method of claim 12, further comprising:

forming bottom source/drain regions on the second semiconductor layers of the first and second vertical fins above the isolation layers and the interlayer dielectric layer;

forming a second sacrificial layer on the interlayer dielectric layer and in contact with the bottom source/drain regions formed on the second semiconductor layers of the first and second vertical fins;

forming a second masking layer over the second sacrificial layer, the second masking layer defining a second pattern to be patterned into the second sacrificial layer;

patterning the second sacrificial layer based on the second masking layer to form at least a third patterned sacrificial layer, the third patterned sacrificial layer being in contact with at least one of the bottom source/drain region formed on the second semiconductor layer of the first vertical fin and the bottom source/drain region formed on the second semiconductor layer of the second vertical fin; and removing the second masking layer;

wherein etching the second portion of the stacked vertical transport field-effect transistor structure down through the interlayer dielectric layer to expose the surface of the second patterned sacrificial layer comprises etching the second portion of the stacked vertical transport field-effect transistor structure down through the third patterned sacrificial layer and the interlayer dielectric layer to expose the surface of the second patterned sacrificial layer and to expose a surface of the third patterned sacrificial layer;

wherein removing the second patterned sacrificial layer to form the second channel exposing the top source/drain region formed on the first semiconductor layer of the second vertical fin comprises removing the third patterned sacrificial layer to form a third channel exposing the at least one of the bottom source/drain region formed on the second semiconductor layers of the first vertical fin and the bottom source/drain region formed on the second semiconductor layer of the second vertical fin that was in contact with the third patterned sacrificial layer; and wherein forming the second contact material in the etched second portion of the stacked vertical transport field-effect transistor structure and in the second channel comprises forming the second contact material in the third channel, the second contact material being formed in contact with the exposed at least one of the bottom source/drain region formed on the second semiconductor layers of the first vertical fin and the bottom source/drain region formed on the second semiconductor layer of the second vertical fin that was in contact with the third patterned sacrificial layer.

17. The method of claim 16, wherein the third patterned sacrificial layer is in contact with the bottom source/drain region formed on the second semiconductor layer of the first vertical fin and the bottom source/drain region formed on the second semiconductor layer of the second vertical fin and extends therebetween.

18. The method of claim 16, wherein the pattern defined by the second masking layer comprises a third rectangular cross-section corresponding to the third patterned sacrificial layer.

19. A method of forming a semiconductor structure, comprising:

forming a stacked vertical transport field-effect transistor structure comprising at least a first vertical fin and a second vertical fin, each vertical fin comprising a first semiconductor layer providing a vertical transport channel for a lower vertical transport field-effect transistor, an isolation layer over the first semiconductor layer, and a second semiconductor layer over the isolation layer providing a vertical transport channel for an upper vertical transport field-effect transistor;

forming top source/drain regions on the first semiconductor layers of the first and second vertical fins below the isolation layers;

forming a first sacrificial layer in contact with the top source/drain regions formed on the first semiconductor layers of the first and second vertical fins and below the isolation layers;

forming a first masking layer over the first sacrificial layer, the first masking layer defining a pattern to be patterned into the first sacrificial layer;

patterning the first sacrificial layer based on the first masking layer to form a first patterned sacrificial layer, the first patterned sacrificial layer being in contact with the top source/drain region formed on the first semiconductor layer of the second vertical fin;

removing the first masking layer;

forming an interlayer dielectric layer on the stacked vertical transport field-effect transistor structure over the first patterned sacrificial layer;

forming bottom source/drain regions on the second semiconductor layers of the first and second vertical fins above the isolation layers and the interlayer dielectric layer;

forming a second sacrificial layer on the interlayer dielectric layer and in contact with the bottom source/drain regions formed on the second semiconductor layers of the first and second vertical fins;

forming a second masking layer over the second sacrificial layer, the second masking layer defining a second pattern to be patterned into the second sacrificial layer;

patterning the second sacrificial layer based on the second masking layer to form a second patterned sacrificial layer, the second patterned sacrificial layer being in contact with the bottom source/drain region formed on the second semiconductor layer of the first vertical fin and in contact with the bottom source/drain region formed on the second semiconductor layer of the second vertical fin;

removing the second masking layer;

etching a portion of the stacked vertical transport field-effect transistor structure down through the second patterned sacrificial layer and through the interlayer dielectric layer to expose a surface of the first patterned sacrificial layer and to expose a surface of the second patterned sacrificial layer;

removing the first and second patterned sacrificial layers to form channels exposing the top source/drain region formed on the first semiconductor layer of the second vertical fin and the bottom source/drain regions formed on the second semiconductor layers of the first and second vertical fins; and forming a contact material in the etched portion of the stacked vertical transport field-effect transistor structure and in the channels, the contact material being formed in contact with the exposed top source/drain region formed on the first semiconductor layer of the second vertical fin and the exposed bottom source/drain regions formed on the second semiconductor layers of the first and second vertical fins.

20. The method of claim 19, wherein the pattern defined by the first masking layer has a rectangular cross-section corresponding to the first patterned sacrificial layer and the pattern defined by the second masking layer has a rectangular cross-section corresponding to the second patterned sacrificial layer.

\* \* \* \* \*